(12) United States Patent
Rud et al.

(10) Patent No.: US 9,602,122 B2
(45) Date of Patent: Mar. 21, 2017

(54) PROCESS VARIABLE MEASUREMENT NOISE DIAGNOSTIC

(71) Applicant: Rosemount Inc., Chanhassen, MN (US)

(72) Inventors: Jason Harold Rud, Mayer, MN (US); Loren Michael Engelstad, Norwood, MN (US)

(73) Assignee: Rosemount Inc., Chanhassen, MN (US)

( * ) Notice: Subject to any disclaimer, the term of this patent is extended or adjusted under 35 U.S.C. 154(b) by 240 days.

(21) Appl. No.: 13/631,048

(22) Filed: Sep. 28, 2012

(65) Prior Publication Data

US 2014/0095095 A1    Apr. 3, 2014

(51) Int. Cl.
*H03M 1/10* (2006.01)
*G05B 23/02* (2006.01)

(52) U.S. Cl.
CPC ...... *H03M 1/1071* (2013.01); *G05B 23/0221* (2013.01)

(58) Field of Classification Search
CPC . H04N 5/365; H04N 5/3651; A61F 2011/145; G05B 23/0221; G01M 13/028; G01D 3/02; G01R 29/26; H01J 2237/24495; H04L 1/205; H03M 1/1071
USPC ..................... 702/17, 69, 190–195
See application file for complete search history.

(56) References Cited

U.S. PATENT DOCUMENTS

| | | | |
|---|---|---|---|
| 3,096,434 A | 7/1963 | King | 235/151 |
| 3,404,264 A | 10/1968 | Kugler | 235/194 |
| 3,468,164 A | 9/1969 | Sutherland | 73/343 |
| 3,590,370 A | 6/1971 | Fleischer | 324/51 |
| 3,618,592 A | 11/1971 | Stewart | 128/2.05 R |
| 3,688,190 A | 8/1972 | Blum | 324/61 R |
| 3,691,842 A | 9/1972 | Akeley | 73/398 C |
| 3,701,280 A | 10/1972 | Stroman | 73/194 |
| 3,849,637 A | 11/1974 | Caruso et al. | 235/151 |
| 3,855,858 A | 12/1974 | Cushing | 73/194 EM |
| 3,924,068 A * | 12/1975 | Fletcher et al. | 375/333 |

(Continued)

FOREIGN PATENT DOCUMENTS

| | | |
|---|---|---|
| CA | 999950 | 11/1976 |
| CN | 1185841 | 6/1998 |

(Continued)

OTHER PUBLICATIONS

U.S. Appl. No. 09/257,896, filed Feb. 25, 1999, Eryurek et al.

(Continued)

*Primary Examiner* — Janet Suglo
*Assistant Examiner* — Lisa Peters
(74) *Attorney, Agent, or Firm* — Westman, Champlin & Koehler, P.A.

(57) ABSTRACT

A process variable transmitter, includes an analog-to-digital (A/D) converter that receives a sensor signal provided by a sensor that senses a process variable and converts the sensor signal to a digital signal. A processor receives the digital signal and provides a measurement output indicative of the digital signal. A noise detector receives the sensor signal and generates a first value indicative of a number of positive noise events relative to a positive threshold value and a second value indicative of a number of negative noise events relative to a negative threshold value. The processor evaluates the noise count and generates a noise output, indicative of detected noise, based on the first and second values.

21 Claims, 9 Drawing Sheets

(56) References Cited

U.S. PATENT DOCUMENTS

| | | | |
|---|---|---|---|
| 3,948,098 A | 4/1976 | Richardson et al. | 73/861.24 |
| 3,952,759 A | 4/1976 | Ottenstein | 137/12 |
| 3,973,184 A | 8/1976 | Raber | 324/51 |
| RE29,383 E | 9/1977 | Gallatin et al. | 137/14 |
| 4,058,975 A | 11/1977 | Gilbert et al. | 60/39.28 |
| 4,083,031 A | 4/1978 | Pharo, Jr. | 367/135 |
| 4,099,413 A | 7/1978 | Ohte et al. | 73/359 |
| 4,102,199 A | 7/1978 | Talpouras | 73/362 |
| 4,122,719 A | 10/1978 | Carlson et al. | 73/342 |
| 4,249,164 A | 2/1981 | Tivy | 340/870.3 |
| 4,250,490 A | 2/1981 | Dahlke | 340/870.37 |
| 4,255,964 A | 3/1981 | Morison | 73/24.01 |
| 4,279,013 A | 7/1981 | Cameron et al. | 340/870.37 |
| 4,337,516 A | 6/1982 | Murphy et al. | 364/551 |
| 4,383,443 A | 5/1983 | Langdon | 73/290 |
| 4,390,321 A | 6/1983 | Langlois et al. | 417/15 |
| 4,399,824 A | 8/1983 | Davidson | 128/736 |
| 4,417,312 A | 11/1983 | Cronin et al. | 364/510 |
| 4,423,634 A | 1/1984 | Audenard et al. | 73/587 |
| 4,446,741 A | 5/1984 | Sirokorad et al. | 73/654 |
| 4,459,858 A | 7/1984 | Marsh | 73/861.12 |
| 4,463,612 A | 8/1984 | Thompson | 73/861.22 |
| 4,517,468 A | 5/1985 | Kemper et al. | 290/52 |
| 4,528,869 A | 7/1985 | Kubo et al. | 74/695 |
| 4,530,234 A | 7/1985 | Cullick et al. | 73/53 |
| 4,536,753 A | 8/1985 | Parker | 340/566 |
| 4,540,468 A | 9/1985 | Genco et al. | 162/49 |
| 4,571,689 A | 2/1986 | Hildebrand et al. | 364/481 |
| 4,630,265 A | 12/1986 | Sexton | 370/85 |
| 4,635,214 A | 1/1987 | Kasai et al. | 364/551 |
| 4,642,782 A | 2/1987 | Kemper et al. | 364/550 |
| 4,644,479 A | 2/1987 | Kemper et al. | 364/550 |
| 4,649,515 A | 3/1987 | Thompson et al. | 364/900 |
| 4,668,473 A | 5/1987 | Agarwal | 422/62 |
| 4,686,638 A | 8/1987 | Furuse | 364/558 |
| 4,696,191 A | 9/1987 | Claytor et al. | 73/600 |
| 4,705,212 A | 11/1987 | Miller et al. | 236/54 |
| 4,707,796 A | 11/1987 | Calabro et al. | 364/552 |
| 4,720,806 A | 1/1988 | Schippers et al. | 364/551 |
| 4,736,367 A | 4/1988 | Wroblewski et al. | 370/85 |
| 4,736,763 A | 4/1988 | Britton et al. | 137/10 |
| 4,758,308 A | 7/1988 | Carr | 162/263 |
| 4,777,585 A | 10/1988 | Kokawa et al. | 364/164 |
| 4,807,151 A | 2/1989 | Citron | 364/510 |
| 4,818,994 A | 4/1989 | Orth et al. | 340/501 |
| 4,831,564 A | 5/1989 | Suga | 364/551.01 |
| 4,833,922 A | 5/1989 | Frick et al. | 73/756 |
| 4,841,286 A | 6/1989 | Kummer | 340/653 |
| 4,853,693 A | 8/1989 | Eaton-Williams | 340/588 |
| 4,866,628 A | 9/1989 | Natarajan | 700/102 |
| 4,873,655 A | 10/1989 | Kondraske | 364/553 |
| 4,907,167 A | 3/1990 | Skeirik | 364/500 |
| 4,924,418 A | 5/1990 | Backman et al. | 364/550 |
| 4,926,364 A | 5/1990 | Brotherton | 364/581 |
| 4,934,196 A | 6/1990 | Romano | 73/861.38 |
| 4,939,753 A | 7/1990 | Olson | 375/107 |
| 4,964,125 A | 10/1990 | Kim | 371/15.1 |
| 4,988,990 A | 1/1991 | Warrior | 340/25.5 |
| 4,992,965 A | 2/1991 | Holter et al. | 364/551.01 |
| 5,005,142 A | 4/1991 | Lipchak et al. | 364/550 |
| 5,019,760 A | 5/1991 | Chu et al. | 318/490 |
| 5,025,344 A | 6/1991 | Maly et al. | 361/88 |
| 5,043,862 A | 8/1991 | Takahashi et al. | 364/162 |
| 5,047,990 A | 9/1991 | Gafos et al. | 367/6 |
| 5,053,815 A | 10/1991 | Wendell | 355/208 |
| 5,057,774 A | 10/1991 | Verhelst et al. | 324/537 |
| 5,067,099 A | 11/1991 | McCown et al. | 364/550 |
| 5,081,598 A | 1/1992 | Bellows et al. | 364/550 |
| 5,089,979 A | 2/1992 | McEachern et al. | 364/571.04 |
| 5,089,984 A | 2/1992 | Struger et al. | 395/650 |
| 5,094,109 A | 3/1992 | Dean et al. | 73/718 |
| 5,098,197 A | 3/1992 | Shepard et al. | 374/120 |
| 5,099,436 A | 3/1992 | McCown et al. | 364/550 |
| 5,103,409 A | 4/1992 | Shimizu et al. | 364/556 |
| 5,111,531 A | 5/1992 | Grayson et al. | 395/23 |
| 5,121,467 A | 6/1992 | Skeirik | 395/11 |
| 5,122,794 A | 6/1992 | Warrior | 340/825.2 |
| 5,122,976 A | 6/1992 | Bellows et al. | 364/550 |
| 5,130,936 A | 7/1992 | Sheppard et al. | 364/551.01 |
| 5,134,574 A | 7/1992 | Beaverstock et al. | 364/551.01 |
| 5,137,370 A | 8/1992 | McCullock et al. | 374/173 |
| 5,142,612 A | 8/1992 | Skeirik | 395/11 |
| 5,143,452 A | 9/1992 | Maxedon et al. | 374/170 |
| 5,148,378 A | 9/1992 | Shibayama et al. | 364/551.07 |
| 5,150,289 A | 9/1992 | Badavas | 364/154 |
| 5,167,009 A | 11/1992 | Skeirik | 395/27 |
| 5,175,678 A | 12/1992 | Frerichs et al. | 364/148 |
| 5,193,143 A | 3/1993 | Kaemmerer et al. | 395/51 |
| 5,195,098 A * | 3/1993 | Johnson et al. | 714/753 |
| 5,197,114 A | 3/1993 | Skeirik | 395/22 |
| 5,197,328 A | 3/1993 | Fitzgerald | 73/168 |
| 5,212,765 A | 5/1993 | Skeirik | 395/11 |
| 5,214,582 A | 5/1993 | Gray | 364/424.03 |
| 5,216,226 A | 6/1993 | Miyoshi | 219/497 |
| 5,224,203 A | 6/1993 | Skeirik | 395/22 |
| 5,228,780 A | 7/1993 | Shepard et al. | 374/175 |
| 5,235,527 A | 8/1993 | Ogawa et al. | 364/571.05 |
| 5,265,031 A | 11/1993 | Malczewski | 364/497 |
| 5,265,222 A | 11/1993 | Nishiya et al. | 395/3 |
| 5,267,241 A | 11/1993 | Kowal | 714/706 |
| 5,269,311 A | 12/1993 | Kirchner et al. | 128/672 |
| 5,274,572 A | 12/1993 | O'Neill et al. | 364/550 |
| 5,282,131 A | 1/1994 | Rudd et al. | 364/164 |
| 5,282,261 A | 1/1994 | Skeirik | 395/22 |
| 5,293,585 A | 3/1994 | Morita | 395/52 |
| 5,303,181 A | 4/1994 | Stockton | 365/96 |
| 5,305,230 A | 4/1994 | Matsumoto et al. | 364/495 |
| 5,311,421 A | 5/1994 | Nomura et al. | 364/157 |
| 5,317,520 A | 5/1994 | Castle | 364/482 |
| 5,327,357 A | 7/1994 | Feinstein et al. | 364/502 |
| 5,333,240 A | 7/1994 | Matsumoto et al. | 395/23 |
| 5,340,271 A | 8/1994 | Freeman et al. | 415/1 |
| 5,347,843 A | 9/1994 | Orr et al. | 73/3 |
| 5,349,541 A | 9/1994 | Alexandro, Jr. et al. | 364/578 |
| 5,357,449 A | 10/1994 | Oh | 364/551.01 |
| 5,361,628 A | 11/1994 | Marko et al. | 73/116 |
| 5,365,423 A | 11/1994 | Chand | 364/140 |
| 5,365,787 A | 11/1994 | Hernandez et al. | 73/660 |
| 5,367,612 A | 11/1994 | Bozich et al. | 395/22 |
| 5,369,674 A | 11/1994 | Yokose et al. | 376/245 |
| 5,384,699 A | 1/1995 | Levy et al. | 364/413.13 |
| 5,386,373 A | 1/1995 | Keeler et al. | 364/577 |
| 5,388,465 A | 2/1995 | Okaniwa et al. | 73/861.17 |
| 5,392,293 A | 2/1995 | Hsue | 324/765 |
| 5,394,341 A | 2/1995 | Kepner | 364/551.01 |
| 5,394,543 A | 2/1995 | Hill et al. | 395/575 |
| 5,404,064 A | 4/1995 | Mermelstein et al. | 310/319 |
| 5,408,406 A | 4/1995 | Mathur et al. | 364/163 |
| 5,408,586 A | 4/1995 | Skeirik | 395/23 |
| 5,410,495 A | 4/1995 | Ramamurthi | 364/511.05 |
| 5,414,645 A | 5/1995 | Hirano | 364/551.01 |
| 5,419,197 A | 5/1995 | Ogi et al. | 73/659 |
| 5,430,642 A | 7/1995 | Nakajima et al. | 364/148 |
| 5,434,774 A | 7/1995 | Seberger | 364/172 |
| 5,436,705 A | 7/1995 | Raj | 355/246 |
| 5,440,478 A | 8/1995 | Fisher et al. | 364/188 |
| 5,442,639 A | 8/1995 | Crowder et al. | 371/20.1 |
| 5,467,355 A | 11/1995 | Umeda et al. | 364/571.04 |
| 5,469,070 A | 11/1995 | Koluvek | 324/713 |
| 5,469,156 A | 11/1995 | Kogura | 340/870.38 |
| 5,469,735 A | 11/1995 | Watanabe | 73/118.1 |
| 5,469,749 A | 11/1995 | Shimada et al. | 73/861.47 |
| 5,481,199 A | 1/1996 | Anderson et al. | 324/705 |
| 5,481,200 A | 1/1996 | Voegele et al. | 324/718 |
| 5,483,387 A | 1/1996 | Bauhahn et al. | 359/885 |
| 5,485,753 A | 1/1996 | Burns et al. | 73/720 |
| 5,486,996 A | 1/1996 | Samad et al. | 364/152 |
| 5,488,697 A | 1/1996 | Kaemmerer et al. | 395/51 |
| 5,489,831 A | 2/1996 | Harris | 318/701 |
| 5,495,769 A | 3/1996 | Broden et al. | 73/718 |
| 5,510,779 A | 4/1996 | Maltby et al. | 340/870.3 |
| 5,511,004 A | 4/1996 | Dubost et al. | 364/551.01 |
| 5,526,293 A | 6/1996 | Mozumder et al. | 364/578 |
| 5,539,638 A | 7/1996 | Keeler et al. | 364/424.03 |

(56) References Cited

U.S. PATENT DOCUMENTS

| | | | |
|---|---|---|---|
| 5,548,528 A | 8/1996 | Keeler et al. | 364/497 |
| 5,549,137 A | 8/1996 | Lenz et al. | 137/486 |
| 5,551,306 A | 9/1996 | Scarpa | 73/861.16 |
| 5,555,190 A | 9/1996 | Derby et al. | 364/510 |
| 5,560,246 A | 10/1996 | Bottinger et al. | 73/861.15 |
| 5,561,599 A | 10/1996 | Lu | 364/164 |
| 5,570,034 A | 10/1996 | Needham et al. | 324/763 |
| 5,570,300 A | 10/1996 | Henry et al. | 364/551.01 |
| 5,572,420 A | 11/1996 | Lu | 364/153 |
| 5,572,438 A | 11/1996 | Ehlers et al. | 700/295 |
| 5,573,032 A | 11/1996 | Lenz et al. | 137/486 |
| 5,578,763 A | 11/1996 | Spencer et al. | 73/861.08 |
| 5,591,922 A | 1/1997 | Segeral et al. | 73/861.04 |
| 5,598,521 A | 1/1997 | Kilgore et al. | 395/326 |
| 5,600,148 A | 2/1997 | Cole et al. | 250/495.1 |
| 5,600,942 A * | 2/1997 | Strosser | G01V 3/08 340/684 |
| 5,608,650 A | 3/1997 | McClendon et al. | 364/510 |
| 5,623,605 A | 4/1997 | Keshav et al. | 395/200.17 |
| 5,629,870 A | 5/1997 | Farag et al. | 364/551.01 |
| 5,633,809 A | 5/1997 | Wissenbach et al. | 364/510 |
| 5,637,802 A | 6/1997 | Frick et al. | 73/724 |
| 5,640,491 A | 6/1997 | Bhat et al. | 395/22 |
| 5,644,240 A | 7/1997 | Brugger | 324/439 |
| 5,650,943 A | 7/1997 | Powell et al. | 702/51 |
| 5,654,869 A | 8/1997 | Ohi et al. | 361/540 |
| 5,661,668 A | 8/1997 | Yemini et al. | 364/550 |
| 5,665,899 A | 9/1997 | Willcox | 73/1.63 |
| 5,668,322 A | 9/1997 | Broden | 73/756 |
| 5,669,713 A | 9/1997 | Schwartz et al. | 374/1 |
| 5,671,335 A | 9/1997 | Davis et al. | 395/23 |
| 5,672,247 A | 9/1997 | Pangalos et al. | 162/65 |
| 5,675,504 A | 10/1997 | Serodes et al. | 364/496 |
| 5,675,724 A | 10/1997 | Beal et al. | 395/182.02 |
| 5,680,109 A | 10/1997 | Lowe et al. | 340/608 |
| 5,682,317 A | 10/1997 | Keeler et al. | 364/431.03 |
| 5,682,476 A | 10/1997 | Tapperson et al. | 370/225 |
| 5,700,090 A | 12/1997 | Eryurek | 374/210 |
| 5,703,575 A | 12/1997 | Kirkpatrick | 340/870.17 |
| 5,704,011 A | 12/1997 | Hansen et al. | 395/22 |
| 5,705,754 A | 1/1998 | Keita et al. | 73/861.357 |
| 5,705,978 A | 1/1998 | Frick et al. | 340/511 |
| 5,708,211 A | 1/1998 | Jepson et al. | 73/861.04 |
| 5,708,585 A | 1/1998 | Kushion | 364/431.061 |
| 5,710,370 A | 1/1998 | Shanahan et al. | 73/1.35 |
| 5,710,708 A | 1/1998 | Wiegland | 364/470.1 |
| 5,713,668 A | 2/1998 | Lunghofer et al. | 374/179 |
| 5,719,378 A | 2/1998 | Jackson, Jr. et al. | 219/497 |
| 5,731,522 A | 3/1998 | Sittler | 73/708 |
| 5,734,975 A * | 3/1998 | Zele et al. | 455/307 |
| 5,736,649 A | 4/1998 | Kawasaki et al. | 73/861.23 |
| 5,741,074 A | 4/1998 | Wang et al. | 374/185 |
| 5,742,845 A | 4/1998 | Wagner | 395/831 |
| 5,745,049 A | 4/1998 | Akiyama et al. | 340/870.17 |
| 5,746,511 A | 5/1998 | Eryurek et al. | 374/2 |
| 5,747,701 A | 5/1998 | Marsh et al. | 73/861.23 |
| 5,752,008 A | 5/1998 | Bowling | 395/500 |
| 5,764,539 A | 6/1998 | Rani | 364/557 |
| 5,764,891 A | 6/1998 | Warrior | 395/200.2 |
| 5,781,024 A | 7/1998 | Blomberg et al. | 324/763 |
| 5,781,878 A | 7/1998 | Mizoguchi et al. | 701/109 |
| 5,790,413 A | 8/1998 | Bartusiak et al. | 364/485 |
| 5,796,006 A | 8/1998 | Bellet et al. | 73/661 |
| 5,801,689 A | 9/1998 | Huntsman | 345/329 |
| 5,805,442 A | 9/1998 | Crater et al. | 364/138 |
| 5,817,950 A | 10/1998 | Wiklund et al. | 73/861.66 |
| 5,825,664 A | 10/1998 | Warrior et al. | 700/7 |
| 5,828,567 A | 10/1998 | Eryurek et al. | 700/79 |
| 5,829,876 A | 11/1998 | Schwartz et al. | 374/1 |
| 5,848,383 A | 12/1998 | Yuuns | 702/102 |
| 5,854,993 A | 12/1998 | Crichnik | 702/54 |
| 5,854,994 A | 12/1998 | Canada et al. | 702/56 |
| 5,859,964 A | 1/1999 | Wang et al. | 395/185.01 |
| 5,869,772 A | 2/1999 | Storer | 73/861.24 |
| 5,876,122 A | 3/1999 | Eryurek | 374/183 |
| 5,880,376 A | 3/1999 | Sai et al. | 73/861.08 |
| 5,887,978 A | 3/1999 | Lunghofer et al. | 374/179 |
| 5,900,801 A | 5/1999 | Heagle et al. | 340/286.09 |
| 5,908,990 A | 6/1999 | Cummings | 73/861.22 |
| 5,920,016 A | 7/1999 | Broden | 73/756 |
| 5,923,557 A | 7/1999 | Eidson | 364/471.03 |
| 5,924,086 A | 7/1999 | Mathur et al. | 706/25 |
| 5,926,778 A | 7/1999 | Pöppel | 702/130 |
| 5,934,371 A | 8/1999 | Bussear et al. | 166/53 |
| 5,936,514 A | 8/1999 | Anderson et al. | 340/310.01 |
| 5,940,290 A | 8/1999 | Dixon | 364/138 |
| 5,956,663 A | 9/1999 | Eryurek et al. | 702/183 |
| 5,965,819 A | 10/1999 | Piety et al. | 73/660 |
| 5,970,430 A | 10/1999 | Burns et al. | 702/122 |
| 5,995,910 A | 11/1999 | Discenzo | 702/56 |
| 6,002,952 A | 12/1999 | Diab et al. | 600/310 |
| 6,006,338 A | 12/1999 | Longsdorf et al. | 713/340 |
| 6,014,612 A | 1/2000 | Larson et al. | 702/183 |
| 6,014,902 A | 1/2000 | Lewis et al. | 73/861.12 |
| 6,016,523 A | 1/2000 | Zimmerman et al. | 710/63 |
| 6,016,706 A | 1/2000 | Yamamoto et al. | 9/6 |
| 6,017,143 A | 1/2000 | Eryurek et al. | 700/51 |
| 6,023,399 A | 2/2000 | Kogure | 361/23 |
| 6,026,352 A | 2/2000 | Burns et al. | 702/182 |
| 6,038,579 A | 3/2000 | Sekine | 708/400 |
| 6,041,287 A | 3/2000 | Dister et al. | 702/182 |
| 6,045,260 A | 4/2000 | Schwartz et al. | 374/183 |
| 6,046,642 A | 4/2000 | Brayton et al. | 330/296 |
| 6,047,220 A | 4/2000 | Eryurek et al. | 700/28 |
| 6,047,222 A | 4/2000 | Burns et al. | 700/79 |
| 6,047,244 A | 4/2000 | Rud, Jr. | 702/98 |
| 6,052,655 A | 4/2000 | Kobayashi et al. | 702/184 |
| 6,059,254 A | 5/2000 | Sundet et al. | 248/678 |
| 6,061,603 A | 5/2000 | Papadopoulos et al. | 700/83 |
| 6,072,150 A | 6/2000 | Sheffer | 219/121.83 |
| 6,094,600 A | 7/2000 | Sharpe, Jr. et al. | 700/19 |
| 6,112,131 A | 8/2000 | Ghorashi et al. | 700/142 |
| 6,119,047 A | 9/2000 | Eryurek et al. | 700/28 |
| 6,119,529 A | 9/2000 | Di Marco et al. | 73/861.68 |
| 6,139,180 A | 10/2000 | Usher et al. | 374/1 |
| 6,151,560 A | 11/2000 | Jones | 702/58 |
| 6,179,964 B1 | 1/2001 | Begemann et al. | 162/198 |
| 6,182,501 B1 | 2/2001 | Furuse et al. | 73/49.2 |
| 6,192,281 B1 | 2/2001 | Brown et al. | 700/2 |
| 6,195,591 B1 | 2/2001 | Nixon et al. | 700/2 |
| 6,199,018 B1 | 3/2001 | Quist et al. | 702/34 |
| 6,209,048 B1 | 3/2001 | Wolff | 710/62 |
| 6,236,948 B1 | 5/2001 | Eck et al. | 702/45 |
| 6,237,424 B1 | 5/2001 | Salmasi et al. | 73/861.17 |
| 6,260,004 B1 | 7/2001 | Hays et al. | 702/183 |
| 6,263,487 B1 | 7/2001 | Stripf et al. | 717/1 |
| 6,272,438 B1 | 8/2001 | Cunningham et al. | 702/56 |
| 6,289,735 B1 | 9/2001 | Dister et al. | 73/579 |
| 6,298,377 B1 | 10/2001 | Hartikainen et al. | 709/223 |
| 6,298,454 B1 | 10/2001 | Schleiss et al. | 714/37 |
| 6,304,828 B1 * | 10/2001 | Swanick et al. | 702/107 |
| 6,307,483 B1 | 10/2001 | Westfield et al. | 340/870.11 |
| 6,311,136 B1 | 10/2001 | Henry et al. | 702/45 |
| 6,317,701 B1 | 11/2001 | Pyostsia et al. | 702/188 |
| 6,327,914 B1 | 12/2001 | Dutton | 73/861.356 |
| 6,347,252 B1 | 2/2002 | Behr et al. | 700/2 |
| 6,356,191 B1 | 3/2002 | Kirkpatrick et al. | 340/501 |
| 6,360,277 B1 | 3/2002 | Ruckley et al. | 9/250 |
| 6,370,448 B1 | 4/2002 | Eryurek et al. | 700/282 |
| 6,377,859 B1 | 4/2002 | Brown et al. | 700/79 |
| 6,378,364 B1 | 4/2002 | Pelletier et al. | 73/152.47 |
| 6,396,426 B1 | 5/2002 | Balard et al. | 341/120 |
| 6,397,114 B1 | 5/2002 | Eryurek et al. | 700/51 |
| 6,405,099 B1 | 6/2002 | Nagai et al. | 700/159 |
| 6,425,038 B1 | 7/2002 | Sprecher | 710/269 |
| 6,434,504 B1 | 8/2002 | Eryurek et al. | 702/130 |
| 6,449,574 B1 | 9/2002 | Eryurek et al. | 702/99 |
| 6,473,656 B1 | 10/2002 | Langels et al. | 700/17 |
| 6,473,710 B1 | 10/2002 | Eryurek | 702/133 |
| 6,480,793 B1 | 11/2002 | Martin | 702/45 |
| 6,492,921 B1 | 12/2002 | Kunitani et al. | 341/118 |
| 6,493,689 B2 | 12/2002 | Kotoulas et al. | 706/23 |
| 6,497,222 B2 | 12/2002 | Bolz et al. | 123/476 |
| 6,505,517 B1 | 1/2003 | Eryurek et al. | 73/861.08 |

(56) References Cited

U.S. PATENT DOCUMENTS

| | | | |
|---|---|---|---|
| 6,519,546 B1 | 2/2003 | Eryurek et al. | 702/130 |
| 6,530,259 B1 | 3/2003 | Kelly et al. | 73/23.2 |
| 6,532,392 B1 | 3/2003 | Eryurek et al. | 700/54 |
| 6,539,267 B1 | 3/2003 | Eryurek et al. | 700/51 |
| 6,546,814 B1 | 4/2003 | Choe et al. | 73/862.08 |
| 6,556,145 B1 | 4/2003 | Kirkpatrick et al. | 340/870.17 |
| 6,561,038 B2 | 5/2003 | Gravel et al. | 73/729.2 |
| 6,564,268 B1 | 5/2003 | Davis et al. | 710/11 |
| 6,567,006 B1 | 5/2003 | Lander et al. | 340/605 |
| 6,594,603 B1 | 7/2003 | Eryurek et al. | 702/104 |
| 6,597,997 B2 | 7/2003 | Tingley | 702/34 |
| 6,601,005 B1 | 7/2003 | Eryurek et al. | 702/104 |
| 6,611,775 B1 | 8/2003 | Coursolle et al. | 702/65 |
| 6,614,271 B1* | 9/2003 | Jin et al. | 327/77 |
| 6,615,149 B1 | 9/2003 | Wehrs | 702/76 |
| 6,637,267 B2 | 10/2003 | Fiebelkorn et al. | 73/587 |
| 6,654,697 B1 | 11/2003 | Eryurek et al. | 702/47 |
| 6,662,120 B2 | 12/2003 | Drahm et al. | 73/861.355 |
| 6,701,274 B1 | 3/2004 | Eryurek et al. | 702/140 |
| 6,722,185 B2 | 4/2004 | Lawson et al. | 73/40 |
| 6,727,812 B2 | 4/2004 | Sauler et al. | 340/511 |
| 6,738,388 B1 | 5/2004 | Stevenson et al. | 370/465 |
| 6,751,560 B1 | 6/2004 | Tingley et al. | 702/51 |
| 6,754,601 B1 | 6/2004 | Eryurek et al. | 702/104 |
| 6,758,168 B2 | 7/2004 | Koskinen et al. | 122/7 |
| 6,859,755 B2 | 2/2005 | Eryurek et al. | 702/183 |
| 6,904,476 B2 | 6/2005 | Hedtke | 710/72 |
| 6,907,383 B2 | 6/2005 | Eryurek et al. | 702/183 |
| 6,915,364 B1 | 7/2005 | Christensen et al. | 710/104 |
| 6,970,003 B2 | 11/2005 | Rome et al. | 324/718 |
| 6,976,503 B2 | 12/2005 | Ens et al. | 137/552 |
| 6,993,445 B2 | 1/2006 | Clarke et al. | 702/106 |
| 7,018,800 B2 | 3/2006 | Huisenga et al. | 435/6 |
| 7,036,381 B2 | 5/2006 | Broden et al. | 73/708 |
| 7,040,179 B2 | 5/2006 | Drahm et al. | 73/861.356 |
| 7,058,542 B2 | 6/2006 | Hauhia et al. | 702/183 |
| 7,085,610 B2 | 8/2006 | Eryurek et al. | 700/29 |
| 7,099,852 B2 | 8/2006 | Unsworth et al. | 706/23 |
| 7,109,883 B2 | 9/2006 | Trimble et al. | 340/870.16 |
| 7,114,516 B2 | 10/2006 | Ito | 137/487.5 |
| 7,171,281 B2 | 1/2007 | Weber et al. | 700/96 |
| 7,254,518 B2 | 8/2007 | Eryurek et al. | 702/183 |
| 7,258,021 B2 | 8/2007 | Broden | 73/756 |
| 7,406,387 B2 | 7/2008 | Hashizume et al. | |
| 7,435,581 B2 | 10/2008 | West | 435/289.1 |
| 7,528,737 B2 | 5/2009 | Hedtke et al. | 374/870.01 |
| 7,577,543 B2 | 8/2009 | Brahmajosyula et al. | |
| 7,680,549 B2 | 3/2010 | Kavaklioglu et al. | |
| 7,766,541 B2 | 8/2010 | Sato | 374/1 |
| 7,821,437 B1* | 10/2010 | Rud et al. | 341/123 |
| 7,827,988 B2 | 11/2010 | Matthews et al. | 128/204.21 |
| 7,949,495 B2 | 5/2011 | Wiklund et al. | |
| 8,311,778 B2* | 11/2012 | Bronczyk et al. | 702/188 |
| 8,401,819 B2 | 3/2013 | Kavaklioglu | 702/179 |
| 9,057,634 B2 | 6/2015 | Rovner et al. | |
| 2002/0013629 A1 | 1/2002 | Nixon et al. | |
| 2002/0029808 A1 | 3/2002 | Friend et al. | 137/551 |
| 2002/0032544 A1 | 3/2002 | Reid et al. | 702/183 |
| 2002/0077711 A1 | 6/2002 | Nixon | 700/19 |
| 2002/0121910 A1 | 9/2002 | Rome et al. | 324/718 |
| 2002/0145568 A1 | 10/2002 | Winter | 343/701 |
| 2002/0148644 A1 | 10/2002 | Schultz et al. | 175/39 |
| 2002/0194547 A1 | 12/2002 | Christenson et al. | 714/43 |
| 2003/0014536 A1 | 1/2003 | Christensen et al. | 709/234 |
| 2003/0033040 A1 | 2/2003 | Billings | 700/97 |
| 2003/0045962 A1 | 3/2003 | Eryurek et al. | 700/128 |
| 2004/0064203 A1* | 4/2004 | Bornside et al. | 700/78 |
| 2004/0128034 A1 | 7/2004 | Lenker et al. | 700/282 |
| 2004/0199361 A1 | 10/2004 | Lu et al. | 702/183 |
| 2004/0249583 A1 | 12/2004 | Eryurek et al. | 702/47 |
| 2005/0011278 A1 | 1/2005 | Brown et al. | 73/861.18 |
| 2005/0072239 A1 | 4/2005 | Longsdorf et al. | 73/649 |
| 2005/0117614 A1* | 6/2005 | Xu et al. | 372/18 |
| 2005/0132808 A1 | 6/2005 | Brown et al. | |
| 2005/0168343 A1 | 8/2005 | Longsdorf et al. | 340/664 |
| 2005/0284237 A1 | 12/2005 | Henry et al. | 73/861.356 |
| 2006/0075009 A1 | 4/2006 | Lenz et al. | 708/160 |
| 2006/0277000 A1 | 12/2006 | Wehrs | 702/183 |
| 2007/0010967 A1* | 1/2007 | Scherr | 702/182 |
| 2007/0010968 A1 | 1/2007 | Longsdorf et al. | 702/183 |
| 2008/0033693 A1 | 2/2008 | Andenna et al. | |
| 2008/0052039 A1 | 2/2008 | Miller et al. | 702/182 |
| 2008/0082294 A1 | 4/2008 | Pihlaja et al. | 702/179 |
| 2008/0103629 A1 | 5/2008 | Milanovic et al. | |
| 2008/0110459 A1* | 5/2008 | Farbarik | 128/204.18 |
| 2008/0208538 A1 | 8/2008 | Visser et al. | 702/190 |
| 2009/0121790 A1* | 5/2009 | Brown et al. | 330/279 |
| 2009/0309574 A1* | 12/2009 | Goupil et al. | 324/76.41 |
| 2010/0011869 A1 | 1/2010 | Klosinski | |
| 2010/0177800 A1 | 7/2010 | Rud et al. | |
| 2011/0071794 A1 | 3/2011 | Bronczyk et al. | 702/188 |
| 2011/0299567 A1 | 12/2011 | Rud et al. | |
| 2012/0041704 A1 | 2/2012 | Rovner et al. | |
| 2012/0051399 A1 | 3/2012 | Rud et al. | |
| 2012/0245895 A1 | 9/2012 | Rud | |
| 2012/0250781 A1 | 10/2012 | Rud et al. | |
| 2013/0046490 A1 | 2/2013 | Arntson et al. | |
| 2013/0080084 A1 | 3/2013 | Miller et al. | 702/50 |
| 2014/0172349 A1 | 6/2014 | Harle | 702/130 |

FOREIGN PATENT DOCUMENTS

| | | |
|---|---|---|
| CN | 1346435 | 4/2002 |
| CN | 101156119 | 4/2008 |
| CN | 101206146 | 6/2008 |
| CN | 101558365 | 10/2009 |
| CN | 102410847 | 4/2012 |
| DE | 32 13 866 A1 | 10/1983 |
| DE | 35 03 597 | 7/1986 |
| DE | 35 40 204 C1 | 9/1986 |
| DE | 40 08 560 A1 | 9/1990 |
| DE | 43 43 747 | 6/1994 |
| DE | 44 33 593 A1 | 6/1995 |
| DE | 195 02 499 A1 | 8/1996 |
| DE | 296 00 609 U1 | 3/1997 |
| DE | 197 04 694 A1 | 8/1997 |
| DE | 19930660 A1 | 7/1999 |
| DE | 199 05 071 | 8/2000 |
| DE | 19905071 A1 | 8/2000 |
| DE | 299 17 651 U1 | 12/2000 |
| DE | 199 47 129 | 4/2001 |
| DE | 100 36 971 A1 | 2/2002 |
| DE | 102 23 725 A1 | 4/2003 |
| EP | 0 122 622 A1 | 10/1984 |
| EP | 0 413 814 A1 | 2/1991 |
| EP | 0 511 553 | 4/1992 |
| EP | 0 487 419 A2 | 5/1992 |
| EP | 0 512 794 A2 | 11/1992 |
| EP | 0 594 227 A1 | 4/1994 |
| EP | 0 624 847 A1 | 11/1994 |
| EP | 0 644 470 A2 | 3/1995 |
| EP | 0 697 586 A2 | 2/1996 |
| EP | 0 749 057 A1 | 12/1996 |
| EP | 0 825 506 A2 | 7/1997 |
| EP | 0 827 096 A2 | 9/1997 |
| EP | 0 838 768 A2 | 9/1997 |
| EP | 1 022 626 A2 | 10/1997 |
| EP | 0 807 804 A2 | 11/1997 |
| EP | 0 827 096 | 3/1998 |
| EP | 1 058 093 A1 | 5/1999 |
| EP | 0 335 957 B1 | 11/1999 |
| EP | 1 022 626 A2 | 7/2000 |
| FR | 2 302 514 | 9/1976 |
| FR | 2 334 827 | 7/1977 |
| GB | 928704 | 6/1963 |
| GB | 1 534 280 | 11/1978 |
| GB | 1 534 288 | 11/1978 |
| GB | 2 310 346 A | 8/1997 |
| GB | 2 317 969 | 4/1998 |
| GB | 2 342 453 A | 4/2000 |
| GB | 2 347 232 A | 8/2000 |
| JP | 56-031573 | 3/1981 |
| JP | 57196619 | 2/1982 |
| JP | 58-129316 | 8/1983 |

(56) References Cited

FOREIGN PATENT DOCUMENTS

| | | |
|---|---|---|
| JP | 59-116811 | 7/1984 |
| JP | 59-163520 | 9/1984 |
| JP | 59-176643 | 10/1984 |
| JP | 59-211196 | 11/1984 |
| JP | 59-211896 | 11/1984 |
| JP | 60-000507 | 1/1985 |
| JP | 60-76619 | 5/1985 |
| JP | 60-131495 | 7/1985 |
| JP | 60-174915 | 9/1985 |
| JP | 62-30915 | 2/1987 |
| JP | 62-080535 | 4/1987 |
| JP | 62-50901 | 9/1987 |
| JP | 63-169532 | 7/1988 |
| JP | 64-01914 | 1/1989 |
| JP | 64-72699 | 3/1989 |
| JP | 11-87430 | 7/1989 |
| JP | 2-05105 | 1/1990 |
| JP | 3-118424 | 5/1991 |
| JP | 3-229124 | 10/1991 |
| JP | 4-70906 | 3/1992 |
| JP | 05-60596 | 3/1993 |
| JP | 5-122768 | 5/1993 |
| JP | 5-164781 | 6/1993 |
| JP | 6-95882 | 4/1994 |
| JP | 06242192 | 9/1994 |
| JP | 06-248224 | 10/1994 |
| JP | 7-063586 | 3/1995 |
| JP | 07234988 | 9/1995 |
| JP | 8-054923 | 2/1996 |
| JP | 8-102241 | 4/1996 |
| JP | 08-114638 | 5/1996 |
| JP | 8-136386 | 5/1996 |
| JP | 8-166309 | 6/1996 |
| JP | 8-247076 | 9/1996 |
| JP | 8-313466 | 11/1996 |
| JP | 9054611 | 2/1997 |
| JP | 2712625 | 10/1997 |
| JP | 2712701 | 10/1997 |
| JP | 2753592 | 3/1998 |
| JP | 07225530 | 5/1998 |
| JP | 10-232170 | 9/1998 |
| JP | 11-083575 | 3/1999 |
| JP | 11-505922 | 5/1999 |
| JP | 3139597 | 12/2000 |
| JP | 2001-501754 | 2/2001 |
| JP | 2002-214185 | 7/2002 |
| JP | 2002-538420 U | 11/2002 |
| JP | 2003-503784 | 1/2003 |
| JP | 2004021712 | 1/2004 |
| JP | 2004034112 | 2/2004 |
| JP | 2004-186445 | 7/2004 |
| JP | 09/005092 | 2/2007 |
| JP | 2007-040763 | 2/2007 |
| JP | 2007-507712 | 3/2007 |
| JP | 2008-513879 | 5/2008 |
| RU | 2056506 | 3/1996 |
| RU | 2190267 C2 | 9/2002 |
| RU | 2008110076 | 9/2009 |
| RU | 2384837 | 3/2010 |
| WO | WO 94/25933 | 11/1994 |
| WO | WO 95/23361 | 8/1995 |
| WO | WO 96/11389 | 4/1996 |
| WO | WO 96/12993 | 5/1996 |
| WO | WO 96/39617 | 12/1996 |
| WO | WO 97/21157 | 6/1997 |
| WO | WO 97/25603 | 7/1997 |
| WO | WO 98/06024 | 2/1998 |
| WO | WO 98/13677 | 4/1998 |
| WO | WO 98/14855 | 4/1998 |
| WO | WO 98/20469 | 5/1998 |
| WO | WO 98/39718 | 9/1998 |
| WO | WO 99/19782 | 4/1999 |
| WO | WO 00/41050 | 7/2000 |
| WO | WO 00/50851 | 8/2000 |
| WO | WO 00/55700 | 9/2000 |
| WO | WO 00/70531 | 11/2000 |
| WO | WO 01/01213 A1 | 1/2001 |
| WO | WO 01/19440 | 3/2001 |
| WO | WO 01/77766 | 10/2001 |
| WO | WO 01/90704 A2 | 11/2001 |
| WO | WO 02/27418 | 4/2002 |
| WO | WO 03/081002 | 10/2003 |
| WO | WO 2005/033639 | 4/2005 |
| WO | WO 2005/093531 | 10/2005 |
| WO | WO 2008/039993 | 4/2008 |

OTHER PUBLICATIONS

"A TCP\IP Tutorial" by, Socolofsky et al., Spider Systems Limited, Jan. 1991 pp. 1-23.
"Approval Standards for Explosionproof Electrical Equipment General Requirements", Factory Mutual Research, Cl. No. 3615, Mar. 1989, pp. 1-34.
"Approval Standard Intrinsically Safe Apparatus and Associated Apparatus for Use in Class I, II, and III, Division 1 Hazardous (Classified) Locations", Factory Mutual Research, Cl. No. 3610, Oct. 1988, pp. 1-70.
"Automation On-line" by, Phillips et al., Plant Services, Jul. 1997, pp. 41-45.
"Climb to New Heights by Controlling your PLCs Over the Internet" by, Phillips et al., Intech, Aug. 1998, pp. 50-51.
"CompProcessor for Piezoresistive Sensors" MCA Technologies Inc. (MCA7707), pp. 1-8, prior to Jan. 2009.
"Ethernet emerges as viable, inexpensive fieldbus", Paul G. Schreier, Personal Engineering, Dec. 1997, p. 23-29.
"Ethernet Rules Closed-loop System" by, Eidson et al., Intech, Jun. 1998, pp. 39-42.
"Fieldbus Standard for Use in Industrial Control Systems Part 2: Physical Layer Specification and Service Definition", ISA-S50.02-1992, pp. 1-93.
"Fieldbus Standard for Use in Industrial Control Systems Part 3: Data Link Service Definition", ISA-S50.02-1997, Part 3, Aug. 1997, pp. 1-159.
Fieldbus Standard for Use in Industrial Control Systems Part 4: Data Link Protocol Specification, ISA-S50.02-1997, Part 4, Aug. 1997, pp. 1-481.
"Fieldbus Support for Process Analysis" by, Blevins et al., Fisher-Rosemount Systems, Inc., 1995, pp. 121-128.
"Fieldbus Technical Overview Understanding FOUNDATION™ fieldbus technology", Fisher-Rosemount, 1998, pp. 1-23.
"Hypertext Transfer Protocol—HTTP/1.0" by, Berners-Lee et al., MIT/LCS, May 1996, pp. 1-54.
"Infranets, Intranets, and the Internet" by, Pradip Madan, Echelon Corp, Sensors, Mar. 1997, pp. 46-50.
"Internet Technology Adoption into Automation" by, Fondl et al., Automation Business, pp. 1-5, prior to Jan. 2009.
"Internet Protocol Darpa Internet Program Protocol Specification" by, Information Sciences Institute, University of Southern California, RFC 791, Sep. 1981, pp. 1-43.
"Introduction to Emit", emWare, Inc., 1997, pp. 1-22.
"Introduction to the Internet Protocols" by, Charles L. Hedrick, Computer Science Facilities Group, Rutgers University, Oct. 3, 1988, pp. 1-97.
"Is There a Future for Ethernet in Industrial Control?", Miclot et al., Plant Engineering, Oct. 1988, pp. 44-46, 48, 50.
LFM/SIMA Internet Remote Diagnostics Research Project Summary Report, Stanford University, Jan. 23, 1997, pp. 1-6.
"Managing Devices with the Web" by, Howard et al., Byte, Sep. 1997, pp. 45-64.
"Modular Microkernel Links GUI and Browser for Embedded Web Devices" by, Tom Williams, pp. 1-2, prior to Jan. 2009.
"PC Software Gets Its Edge From Windows, Components, and the Internet", Wayne Labs, I&CS, Mar. 1997, pp. 23-32.
Proceedings Sensor Expo, Aneheim, California, Produced by Expocon Managemnet Associates, Inc., Apr. 1996, pp. 9-21.
Proceedings Sensor Expo, Boston, Massachuttes, Produced by Expocon Management Associates, Inc., May 1997, pp. 1-416.

(56) References Cited

OTHER PUBLICATIONS

"Smart Sensor Network of the Future" by, Jay Warrior, Sensors, Mar. 1997, pp. 40-45.
"The Embedded Web Site" by, John R. Hines, IEEE Spectrum, Sep. 1996, p. 23.
"Transmission Control Protocol: Darpa Internet Program Protocol Specification" Information Sciences Institute, Sep. 1981, pp. 1-69.
"On-Line Statistical Process Control for a Glass Tank Ingredient Scale," by R.A. Weisman, *IFAC real Time Programming*, 1985, pp. 29-38.
"The Performance of Control Charts for Monitoring Process Variation," by C. Lowry et al., *Commun. Statis.—Simula.*, 1995, pp. 409-437.
"A Knowledge-Based Approach for Detection and Diagnosis of Out-Of-Control Events in Manufacturing Processes," by P. Love et al., *IEEE*, 1989, pp. 736-741.
"Advanced Engine Diagnostics Using Universal Process Modeling", by P. O'Sullivan, *Presented at the 1996 SAE Conference on Future Transportation Technology*, pp. 1-9.
Parallel, Fault-Tolerant Control and Diagnostics System for Feedwater Regulation in PWRS, by E. Eryurek et al., *Proceedings of the American Power Conference*, prior to Jan. 2009.
"Programmable Hardware Architectures for Sensor Validation", by M.P. Henry et al., *Control Eng. Practice*, vol. 4, No. 10., pp. 1339-1354, (1996).
"Sensor Validation for Power Plants Using Adaptive Backpropagation Neural Network," *IEEE Transactions on Nuclear Science*, vol. 37, No. 2, by E. Eryurek et al. Apr. 1990, pp. 1040-1047.
"Signal Processing, Data Handling and Communications: The Case for Measurement Validation", by M.P. Henry, *Department of Engineering Science, Oxford University*.
"Smart Temperature Measurement in the '90s", by T. Kerlin et al., *C&I*, (1990).
"Software-Based Fault-Tolerant Control Design for Improved Power Plant Operation," *IEEE/IFAC Joint Symposium on Computer-Aided Control System Design*, Mar. 7-9, 1994 pp. 585-590.
A Standard Interface for Self-Validating Sensors, by M.P. Henry et al., *Report No. QUEL 1884/91*, (1991).
"Taking Full Advantage of Smart Transmitter Technology Now," by G. Orrison, *Control Engineering*, vol. 42, No. 1, Jan. 1995.
"Using Artificial Neural Networks to Identify Nuclear Power Plant States," by Israel E. Alguindigue et al., pp. 1-4, prior to Jan. 2009.
"Application of Neural Computing Paradigms for Signal Validation," by B.R. Upadhyaya et al., *Department of Nuclear Engineering*, pp. 1-18, prior to Jan. 2009.
"Application of Neural Networks for Sensor Validation and Plant Monitoring," by B. Upadhyaya et al., *Nuclear Technology*, vol. 97, No. 2, Feb. 1992 pp. 170-176.
"Automated Generation of Nonlinear System Characterization for Sensor Failure Detection," by B.R. Upadhyaya et al., *ISA*, 1989 pp. 269-274.
"In Situ Calibration of Nuclear Plant Platinum Resistance Thermometers Using Johnson Noise Methods," *EPRI*, Jun. 1983.
"Johnson Noise Thermometer for High Radiation and High-Temperature Environments," by L. Oakes et al., *Fifth Symposium on Space Nuclear Power Systems*, Jan. 1988, pp. 2-23.
"Development of a Resistance Thermometer for Use Up to 1600°C", by M.J. de Groot et al., *Cal Lab*, Jul./Aug. 1996, pp. 38-41.
"Survey, Applications, and Prospects of Johnson Noise Thermometry," by T. Blalock et al., *Electrical Engineering Department*, 1981 pp. 2-11.
"Noise Thermometry for Industrial and Metrological Applications at KFA Julich," by H. Brixy et al., *7th International Symposium on Temperature*, 1992.
"Johnson Noise Power Thermometer and its Application in Process Temperature Measurement," by T.V. Blalock et al., *American Institute of Physics* 1982, pp. 1249-1259.
"Field-based Architecture is Based on Open Systems, Improves Plant Performance", by P. Cleaveland, *I&CS*, Aug. 1996, pp. 73-74.

"Tuned-Circuit Dual-Mode Johnson Noise Thermometers," by R.L. Shepard et al., Apr. 1992.
"Tuned-Circuit Johnson Noise Thermometry," by Michael Roberts et al., $7^{th}$ *Symposium on Space Nuclear Power Systems*, Jan. 1990.
"Smart Field Devices Provide New Process Data, Increase System Flexibility," by Mark Boland, *I&CS*, Nov. 1994, pp. 45-51.
"Wavelet Analysis of Vibration, Part I: Theory[1]," by D.E. Newland, *Journal of Vibration and Acoustics*, vol. 116, Oct. 1994, pp. 409-416.
"Wavelet Analysis of Vibration, Part 2: Wavelet Maps," by D.E. Newland, *Journal of Vibration and Acoustics*, vol. 116, Oct. 1994, pp. 417-425.
"Development of a Long-Life, High-Reliability Remotely Operated Johnson Noise Thermometer," by R.L. Shepard et al., *ISA*, 1991, pp. 77-84.
"Application of Johnson Noise Thermometry to Space Nuclear Reactors," by M.J. Roberts et al., *Presented at the 6th Symposium on Space Nuclear Power Systems*, Jan. 9-12, 1989.
"A Decade of Progress in High Temperature Johnson Noise Thermometry," by T.V. Blalock et al., *American Institute of Physics*, 1982 pp. 1219-1223.
"Sensor and Device Diagnostics for Predictive and Proactive Maintenance", by B. Boynton, *A Paper Presented at the Electric Power Research Institute—Fossil Plant Maintenance Conference* in Baltimore, Maryland, Jul. 29-Aug. 1, 1996, pp. 50-1-50-6.
"Detection of Hot Spots in Thin Metal Films Using an Ultra Sensitive Dual Channel Noise Measurement System," by G.H. Massiha et al., *Energy and Information Technologies in the Southeast*, vol. 3 of 3, Apr. 1989, pp. 1310-1314.
"Detecting Blockage in Process Connections of Differential Pressure Transmitters", by E. Taya et al., *SICE*, 1995, pp. 1605-1608.
"Development and Application of Neural Network Algorithms for Process Diagnostics," by B.R. Upadhyaya et al., *Proceedings of the 29th Conference on Decision and Control*, 1990, pp. 3277-3282.
"A Fault-Tolerant Interface for Self-Validating Sensors", by M.P. Henry, *Colloquium*, pp. 3/1-3/2 (Nov. 1990).
"Fuzzy Logic and Artificial Neural Networks for Nuclear Power Plant Applications," by R.C. Berkan et al., *Proceedings of the American Power Conference*.
"Fuzzy Logic and Neural Network Applications to Fault Diagnosis", by P. Frank et al., *International Journal of Approximate Reasoning*, (1997), pp. 68-88.
"Keynote Paper: Hardware Compilation—A New Technique for Rapid Prototyping of Digital Systems—Applied to Sensor Validation", by M.P. Henry, *Control Eng. Practice*, vol. 3, No. 7., pp. 907-924, (1995).
"The Implications of Digital Communications on Sensor Validation", by M. Henry et al., *Report No. QUEL 1912/92*, (1992).
"In-Situ Response Time Testing of Thermocouples", *ISA*, by H.M. Hashemian et al., Paper No. 89-0056, pp. 587-593, (1989).
"An Integrated Architecture for Signal Validation in Power Plants," by B.R. Upadhyaya et al., *Third IEEE International Symposium on Intelligent Control*, Aug. 24-26, 1988, pp. 1-6.
"Integration of Multiple Signal Validation Modules for Sensor Monitoring," by B. Upadhyaya et al., *Department of Nuclear Engineering*, Jul. 8, 1990, pp. 1-6.
"Intelligent Behaviour for Self-Validating Sensors", by M.P. Henry, *Advances in Measurement*, pp. 1-7, (May 1990).
"Measurement of the Temperature Fluctuation in a Resistor Generating 1/F Fluctuation," by S. Hashiguchi, *Japanese Journal of Applied Physics*, vol. 22, No. 5, Part 2, May 1983, pp. L284-L286.
"Check of Semiconductor Thermal Resistance Elements by the Method of Noise Thermometry", by A. B. Kisilevskii et al., *Measurement Techniques*, vol. 25, No. 3, Mar. 1982, New York, USA, pp. 244-246.
"Neural Networks for Sensor Validation and Plant Monitoring," by B. Upadhyaya, *International Fast Reactor Safety Meeting*, Aug. 12-16, 1990, pp. 2-10.
"Neural Networks for Sensor Validation and Plantwide Monitoring," by E. Eryurek, 1992.
"A New Method of Johnson Noise Thermometry", by C.J. Borkowski et al., *Rev. Sci. Instrum.*, vol. 45, No. 2, (Feb. 1974) pp. 151-162.

(56) References Cited

OTHER PUBLICATIONS

"Thermocouple Continuity Checker," IBM Technical Disclosure Bulletin, vol. 20, No. 5, pp. 1954 (Oct. 1977).
"A Self-Validating Thermocouple," Janice C-Y et al., IEEE Transactions on Control Systems Technology, vol. 5, No. 2, pp. 239-253 (Mar. 1997).
*Instrument Engineers' Handbook*, Chapter IV entitled "Temperature Measurements," by T.J. Claggett, pp. 266-333 (1982).
"emWare's Releases EMIT 3.0, Allowing Manufacturers to Internet and Network Enable Devices Royalty Free," 3 pages, PR Newswire (Nov. 4, 1998).
Warrior, J., "The IEEE P1451.1 Object Model Network Independent Interfaces for Sensors and Actuators," pp. 1-14, Rosemount Inc. (1997).
Warrior, J., "The Collision Between the Web and Plant Floor Automation," $6^{th}$. WWW Conference Workshop on Embedded Web Technology, Santa Clara, CA (Apr. 7, 1997).
Microsoft Press Computer Dictionary, $3^{rd}$ Edition, p. 124, prior to Jan. 2009.
"Internal Statistical Quality Control for Quality Monitoring Instruments", by P. Girling et al., *ISA*, 15 pgs., 1999.
Web Pages from www.triant.com (3 pgs.), prior to Jan. 2009.
"Statistical Process Control (Practice Guide Series Book)", *Instrument Society of America*, 1995, pp. 1-58 and 169-204.
"Time-Frequency Analysis of Transient Pressure Signals for a Mechanical Heart Valve Cavitation Study," *ASAIO Journal*, by Alex A. Yu et al., vol. 44, No. 5, pp. M475-M479, (Sep.-Oct. 1998).
"Transient Pressure Signals in Mechanical Heart Valve Caviation," by Z.J. Wu et al., pp. M555-M561 (undated).
"Caviation in Pumps, Pipes and Valves," *Process Engineering*, by Dr. Ronald Young, pp. 47 and 49 (Jan. 1990).
"Quantification of Heart Valve Cavitation Based on High Fidelity Pressure Measurements," *Advances in Bioengineering 1994*, by Laura A. Garrison et al., BED—vol. 28, pp. 297-298 (Nov. 6-11, 1994).
"Monitoring and Diagnosis of Cavitation in Pumps and Valves Using the Wigner Distribution," *Hydroaccoustic Facilities, Instrumentation, and Experimental Techniques*, NCA—vol. 10, pp. 31-36 (1991).
"Developing Predictive Models for Cavitation Erosion," *Codes and Standards in a Global Environment*, PVP—vol. 259, pp. 189-192 (1993).
"Self-Diagnosing Intelligent Motors: A Key Enabler for Next Generation Manufacturing System," by Fred M. Discenzo et al., pp. 3/1-3/4 (1999).
"A Microcomputer-Based Instrument for Applications in Platinum Resistance Thermomety," by H. Rosemary Taylor and Hector A. Navarro, Journal of Physics E. Scientific Instrument, vol. 16, No. 11, pp. 1100-1104 (1983).
"Experience in Using Estelle for the Specification and Verification of a Fieldbus Protocol: FIP," by Barretto et al., Computer Networking, pp. 295-304 (1990).
"Computer Simulation of H1 Field Bus Transmission," by Utsumi et al., Advances in Instrumentation and Control, vol. 46, Part 2, pp. 1815-1827 (1991).
"Progress in Fieldbus Developments for Measuring and Control Application," by A. Schwaier, Sensor and Acuators, pp. 115-119 (1991).
"Ein Emulationssystem zur Leistungsanalyse von Feldbussystemen, Teil 1," by R. Hoyer, pp. 335-336 (1991).
"Simulatore Integrato: Controllo su bus di campo," by Barabino et al., Automazione e Strumentazione, pp. 85-91 (Oct. 1993).
"Ein Modulares, verteiltes Diagnose-Expertensystem für die Fehlerdiagnose in lokalen Netzen," by Jürgen M. Schröder, pp. 557-565 (1990).
"Fault Diagnosis of Fieldbus Systems," by Jürgen Quade, pp. 577-581 (Oct. 1992).
"Ziele and Anwendungen von Feldbussystemen," by T. Pfeifer et al., pp. 549-557 (Oct. 1987).

"PROFIBUS Infrastructure Measures," by Tilo Pfeifer et al., pp. 416-419 (Aug. 1991).
"Simulation the Time Behaviour of Fieldbus Systems," by O. Schnelle, pp. 440-442 (1991).
"Modélisation et simulation d'un bus de terrain: FIP," by Song et al, pp. 5-9 (undated).
"Field Bus Networks for Automation Systems Containing Intelligent Functional Unites," by W. Kriesel et al., pp. 486-489 (1987).
"Field Buses for Process Interconnection with Digital Control Systems," Tecnología, pp. 141-147 (1990).
"Decentralised Systems with Real-Time Field Bus," Netzwerke, Jg. Nr.3 v. 14.3, 4 pages (1990).
"Process Measurement and Analysis," by Liptak et al., Instrument Engineers' Handbook, Third Edition, pp. 528-530, (1995).
"Improving Dynamic Performance of Temperature Sensors With Fuzzy Control Techniques," by Wang Lei et al., pp. 872-873 (1992).
"Microsoft Press Computer Dictionary" 2nd Edition, 1994, Microsoft Press. p. 156.
International Search Report from Application No. PCT/US01/40791 with international filing date of May 22, 2001.
International Search Report from Application No. PCT/US01/40782 with international filing date of May 22, 2001.
International Search Report from Application No. PCT/02/14560 with international filing date of May 8, 2002.
International Search Report from Application No. PCT/US02/14934 with international filing date of May 8, 2002.
"On-Line Tool Condition Monitoring System With Wavelet Fuzzy Neural Network," by Li Xiaoli et al., pp. 271-276 (1997).
"Optimal Design of the Coils of an Electromagnetic Flow Meter," by Michalski, A. et al., IEEE Transactions on Magnetics, vol. 34, Issue 5, Part 1, pp. 2563-2566 (1998).
"Magnetic Fluid Flow Meter for Gases," Popa, N.C., IEEE Transactions on Magnetics, vol. 30, Issue 2, Part 1-2, pp. 936-938 (1993).
"New Approach to a Main Error Estimation for Primary Transducer of Electromagnetic Flow Meter," by Michalski, A., IEEE Instrumentation and Measurement Technology Conference Proceedings, vol. 2, pp. 1093-1097 (1998).
"Additional Information From Flowmeters Via Signal Analysis," by Amadi-Echendu, J.E. et al., IEEE Instrumentation and Measurement Technology Conference Record, vol. 7, pp. 187-193 (1990).
International Search Report from Application No. PCT/US02/06606 with international filing date of Mar. 5, 2002.
International Search Report from Application No. PCT/US02/30465 with international filing date of Sep. 25, 2002.
Communication from European patent application No. 07838659.6 dated Jun. 24, 2010.
"What is a weighted moving average?", *DAU Stat Refresher*, http://cne.gmu.edu/modules/dau/stat/mvavgs/wma_bdy.html, (1995).
U.S. Appl. No. 10/675,014, filed Sep. 2003, Longsdorf et al.
U.S. Appl. No. 10/744,809, filed Dec. 2003, Brown et al.
"Statistics Glossary: Time Series Data", by Easton et al., http://www.stats.gla.ac.uk/steps/glossary/time_series.html, Sep. 1997.
"The Indicators Story", Sustainable Seattle, pp. 55-59, 1998.
"Detecting Regimes in Temperature Time Series", by Clemins et al., *Artificial Neural Networks in Engineering, Proceedings*, pp. 727-732, 2001.
"Re: Digital Filter-Moving Average", The Math Forumn, http://mathforum.org/discuss/sci.math/a/t/177212, Sep. 28, 1998.
U.S. Appl. No. 10/893,144, filed Jul. 2004, Brown et al.
"Notification of Transmittal of the International Search Report and the Written Opinion of the International Searching Authority", or the Declaration for PCT/US2004/017300.
"Invitation to Pay Additional Fees" for PCT/US2004/031678.
"Notification of Transmittal of the International Search Report or the Declaration", PCT/US2004/025291.
"Notification of Transmittal of the International Search Report or the Declaration", PCT/US2004/031678.
"Notification of Transmittal of the International Search Report or the Declaration", PCT/US2005/011385.
"Notification of Transmittal of the International Preliminary Report on Patenatability", PCT/US2004/031678.

(56) References Cited

OTHER PUBLICATIONS

"Notification of Transmittal of International Search Report and the Written Opinion", PCT/US2004/022736.
"Notification of Transmittal of the International Search Report", PCT/US00/14798.
"Notification of Transmittal of International Search Report and the Written Opinion", PCT/US2006/037535.
"Notification of Transmittal of International Search Report and the Written Opinion", PCT/US2007/012317.
Samson, Technical Information; HART Communication, Part 4 Communications; 40 pp.
"A Supervision Support System for Industrial Processes" by J. Penalva et al., IEEE, Oct. 1993, pp. 57-65.
"International Search Report" for related Application No. PCT/US2007/017301.
"Written Opinion" for related Application No. PCT/US2007/017301.
Office Action from Chinese Application No. 200780030039.6, dated Dec. 1, 2010.
Office Action from European Application No. 07836452.8, dated Jun. 6, 2011.
Office Action from corresponding Japanese Application No. 2009/524611, dated Jul. 26, 2011, 7 pgs.
Office Action from Japanese Application No. 2010-519967, dated Feb. 7, 2012.
Rejection Decision from the corresponding Chinese patent application No. 2007800357356 dated Mar. 28, 2012.
Second Office Action from the corresponding Japanese patent application No. 2009530377 dated May 22, 2012.
Summons to attend Oral Proceedings from European Patent Application No. 07838659.6, dated Jan. 29, 2013, 6 pages.
Reexamination Notification from Chinese Application No. 2007800357356, dated May 3, 2013, 4 pages.
Decision of Rejection for Japanese Patent Application No. 2009530377, dated Apr. 30, 2013, 2 pages.
Decision of Rejection from corresponding European Patent Application No. 07838659.6, dated Jul. 3, 2013, 11 pages.
"Notification of Transmittal of the International Search Report and the Written Opinion of the International Searching Authority, or the Declaration" for PCT/US2008/009394 filed Aug. 5, 2008; 13 pages.
Office Action from Japanese Application No. 2010-519967, dated Aug. 9, 2012.
Eryurek et al., "Advanced Diagnostics Achieved with Intelligent Sensors and Fieldbus", 2001, Measuremnet and Control vol. 34, p. 293-311.
Canadian Office Action for Canadian App. No. 2,694,936, dated Oct. 16, 2012.
"Experimental and Numerical Investigation of Turbulent Flow Induced Pipe Vibration in Fully Developed Flow", by Pittard et al., Jul. 2004, Review of Scientific Instruments, vol. 75, No. 7, pp. 2393-2401.
"Wireless Sensing of Flow-Induced Vibrations for Pipeline Integrity Monitoring", by Awawdeh et al., 2006, IEEE, pp. 114-117.
Notification of Transmittal of the International Search Report and the Written Opinion of the International Searching Authority, or the Declaration in related PCT Application No. PCT/US2013/061170, filed Sep. 23, 2013, 9 pgs.
Notification of Transmittal of the International Search Report and the Written Opinion of the International Searching Authority, or the Declaration in related PCT Application No. PCT/US2013/044144, dated Apr. 1, 2014.
"Notification of Transmittal of the International Search Report and the Written Opinion of the International Searching Authority", or the Declaration for PCT/US2012/055733, dated Jul. 3, 2013.
"Basics of Vibration Monitoring for Fault Detection and Process Control", by Reimche et al., Jun. 2-6, 2003, PANANDT 2003, Rio de Janeiro, Brasil, 10 pgs.
"The Effect of Change in Flow Rate on the Vibration of Double-Suction Centrifugal Pumps", by Hodkiewicz et al., 2002, Proceedings of the Institution of Mechanical Engineers, Part E: Journal of Process Mechanical Engineering, vol. 216, pp. 47-58.
Communication pursuant to Rules 161(1) and 162 EPC for European Patent Application No. 12780913.5-1557, dated May 22, 2014, 2 pages.
Official Action from Chinese Patent Application No. 201110303797.9, dated Apr. 22, 2014.
"Notification of Transmittal of the International Search Report and the Written Opinion of the International Searching Authority", or the Declaration for PCT/US027409, dated Oct. 17, 2012.
Communication regarding EP Application No. 12713813.9-1802, dated Nov. 8, 2013.
Office Action from Japanese Application No. 2014-501087, dated Aug. 5, 2014.
Summons to attend oral proceedings pursuant to Rule 115(1) EPC for European Patent Application No. 07836452.8-1554, dated Oct. 24, 2014, 4 pages.
Office Action from Chinese App. No. 201110303797.9, dated Dec. 11, 2014.
Communication from European Application No. 13771343.4, dated May 20, 2015.
Office Action from Australian patent Application No. 2013323856, dated Aug. 7, 2015.
Office Action from Chinese App. No. 201210335726.1, dated Feb. 28, 2015.
Office Action from Canadian App. No. 2,838,132, dated Mar. 12, 2015.
Office Action from Russian App. No. 2013146711, dated Feb. 25, 2015.
Office Action from Japanese App. No. 2014/533597, dated Mar. 31, 2015.
Office Action from Japanese App. No. 2014-501087, dated May 19, 2015.
Office Action from Chinese App. No. 201210513583.9, dated Sep. 2, 2015.
Office Action from Chinese App. No. 201110303797.9, dated Jun. 8, 2015.
Office Action from Chinese App. No. 201210063817.4, dated Aug. 10, 2015, 19 pages.
Office Action from Canadian Application No. 2,886,533, dated Mar. 18, 2016.
Notification of Transmittal of the International Search Report and the Written Opinion of the International Searching Authority, or the Declaration for PCT Application No. PCT/US2013/061170, filed Sep. 23, 2013, 9 pgs.
Office Action from Chinese App. No. 201210513583.9, dated Mar. 2, 2016.
Office Action from Australian App. No. 2013323856, dated Feb. 4, 2016.
Office Action from Chinese App. No. 201210063817.4, dated Mar. 10, 2016.
Office Action from Russian Patent Application No. 2015115909, dated Jul. 11, 2016.
Office Action from Chinese App. No. 201210513583.9, dated Aug. 12, 2016.
Office Action from Japanese App. No. 2015-534580, dated Jun. 22, 2016.
Office Action from Canadian Patent Application No. 2,886,533, dated Jan. 6, 2017.
Office Action from European Patent Application No. 13771343.4, dated Jan. 5, 2017.

\* cited by examiner

PROCESS VARIABLE MEASUREMENT NOISE DIAGNOSTIC

BACKGROUND OF THE INVENTION

The present invention relates to process variable transmitters used to measure temperature in process control and monitoring systems. More specifically, the present invention relates to monitoring a noise level within a measurement circuit as the measurement of the process variable is being digitized.

Process variable transmitters are used to measure process parameters in a process control or monitoring system. Microprocessor-based transmitters often include a sensor, an analog-to-digital converter for converting an output from the sensor into a digital form, a microprocessor for compensating the digitized output, and an output circuit for transmitting the compensated output. Currently, this transmission is normally done over a process control loop, such as 4-20 milliamp control loop, or wirelessly.

One exemplary parameter that is measured by such a system is temperature, which is sensed by measuring the resistance of a resistive temperature device (RTD), which is also sometimes called a platinum resistance thermometer or (PRT) or the voltage output by a thermocouple. Of course, these types of temperature sensors are only exemplary and others can be used as well. Similarly, temperature is only one exemplary process variable and a wide variety of other process control parameters can be measured as well, such as pressure, flow, pH, etc. Therefore, while the present discussion proceeds with respect to a temperature sensor, it will be appreciated that the discussion could just as easily proceed with respect to other sensors.

There are a number of connection points, in conventional measurement circuitry, between a temperature sensor and a measurement transmitter that can fail or become degraded. In many temperature measurement applications, it can be very important for the user to understand when the temperature measurement is degraded for any reason, before using the measurement in a control strategy. Degraded conditions can be due to a variety of different reasons, including lead/sensor breakage, excessive line resistance, corroded or loose connections, etc.

A number of diagnostics have been implemented in temperature transmitters in order to evaluate static conditions, such as lead resistance, excessive DC voltage, or sensor breakage. However, any of these static conditions can become transient, dynamic, or non-persistent states that occur during the processing of the measurement. This can lead to a number of sources of measurement inaccuracy.

For instance, during the digitizing process, the voltage input to a measurement analog-to-digital (A/D) converter is averaged, and no information about the noise over the digitization process is provided. Asymmetric noise can cause measurement inaccuracy in the output provided to a control system.

In addition, noise can currently be evaluated from sample-to-sample within a transmitter at the update rate of the transmitter, but in some cases, this can be too slow. Measurement noise that occurs at a higher frequency than the update rate can therefore cause inaccuracy as well.

In addition, excessive line resistance or measurement capacitance (either on the sensor line or internal to the transmitter) can affect the settling time of the measurement circuit. If the settling time is not set long enough, measurement inaccuracies beyond the transmitter's accuracy specification can occur. However, increasing the settling time directly reduces the measurement update rate. Therefore, there can be a tradeoff between the measurement update rate and measurement inaccuracies that occur due to a settling time that is too short.

SUMMARY

A process variable transmitter, includes an analog-to-digital (A/D) converter that receives a sensor signal provided by a sensor that senses a process variable and converts the sensor signal to a digital signal. A processor receives the digital signal and provides a measurement output indicative of the digital signal. A noise detector receives the sensor signal and generates a first value indicative of a number of positive noise events relative to a positive threshold value and a second value indicative of a number of negative noise events relative to a negative threshold value. The processor evaluates the noise count and generates a noise output, indicative of detected noise, based on the first and second values.

DETAILED DESCRIPTION

A noise level detector detects both positive and negative noise events in a process variable transmitter. The detector can do this even while a measurement is being taken so that noise events that change during the measurement can be detected. The detector outputs an indication of the noise to a processor which can characterize the noise and suggest maintenance.

Figure 1:
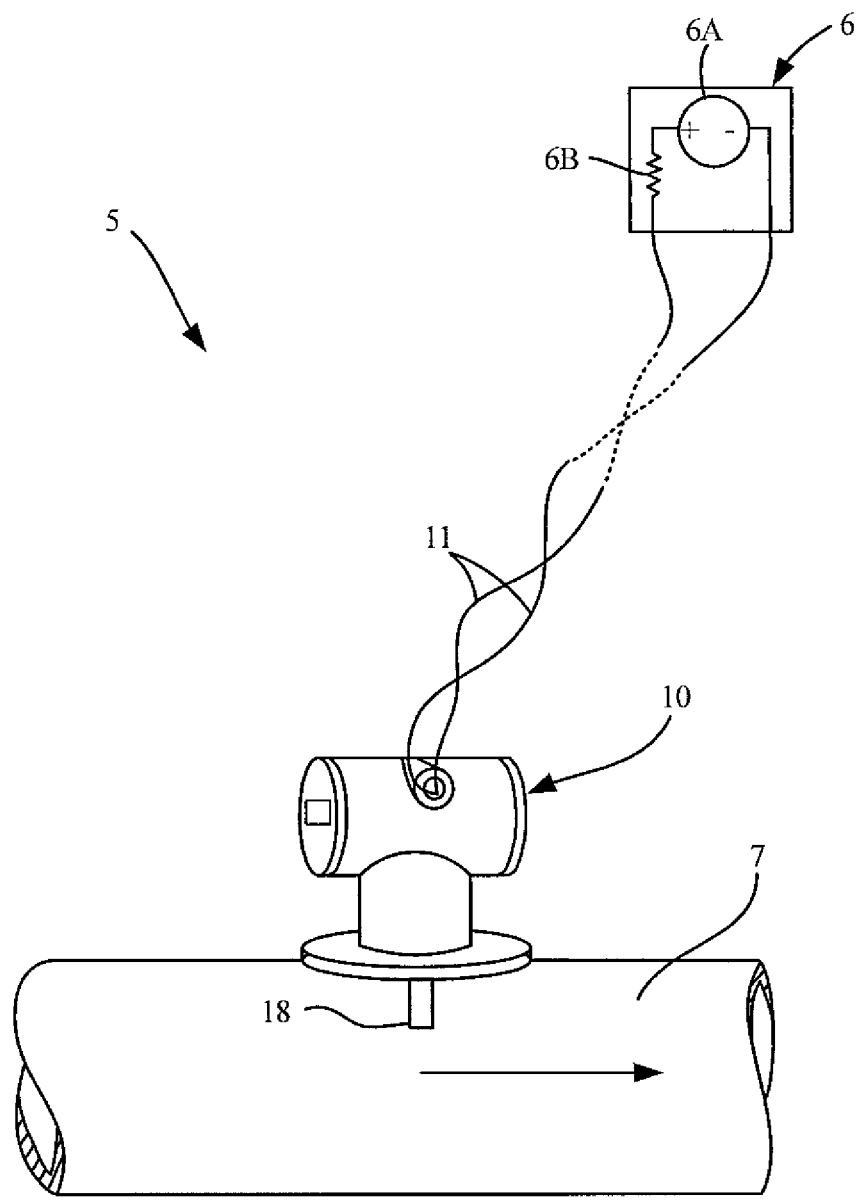
FIG. 1 is a simplified diagram showing an industrial process control system including a temperature sensor configured to sense a temperature of a process fluid.

FIG. 1 is a simplified diagram of an industrial process control system 5. In FIG. 1, process piping 7 carries a process fluid. A process variable transmitter 10 is configured to couple to the process piping 7. Transmitter 10 includes a process variable sensor 18 which, in one embodiment, comprises a thermocouple or other temperature sensor. However, this is exemplary only. Transmitter 10 transmits information to a remote location, such as a process control room 6. The transmission can be over a process control loop such as a two-wire control loop 11. The process control loop can be in accordance with any desired format including, for example, a 4-20 mA process control loop, a process control loop which carries digital communications, a wireless process control loop, etc. In the example shown in FIG. 1, the process control loop 11 is powered by a power supply 6A at control room 6. This power is used to provide power to the process variable transmitter 10. A sense resistor 6B can be used to sense the current flowing through loop 11, although other mechanisms can be used as well.

Figure 2:
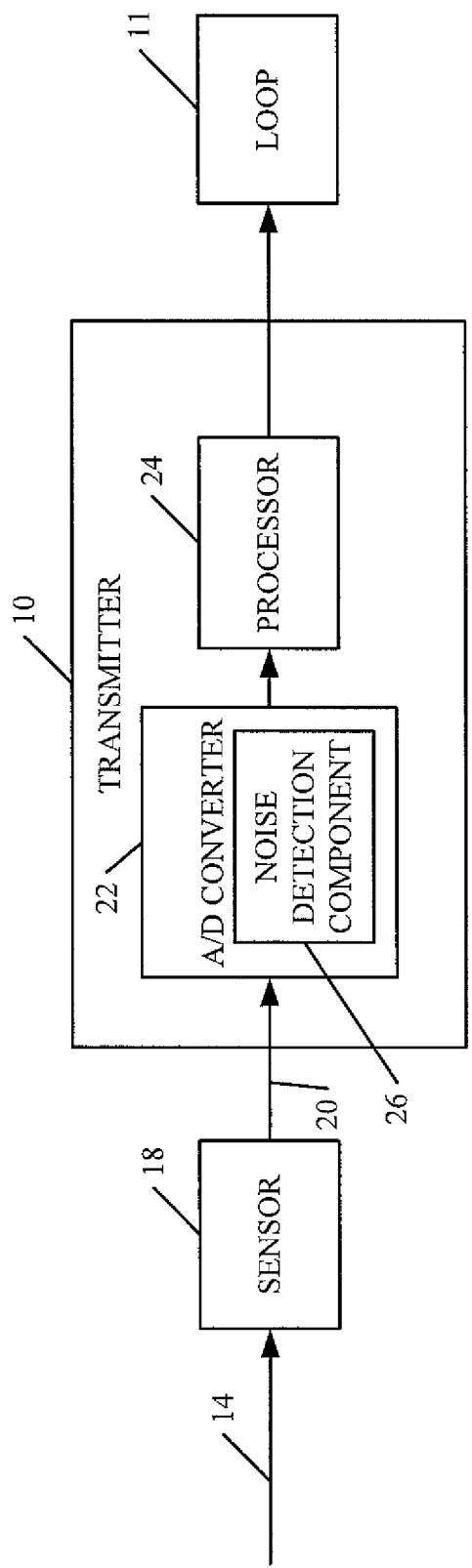
FIG. 2 is a block diagram showing the transmitter of FIG. 1 in more detail.

FIG. 2 is a block diagram of a portion of industrial process control system 5, shown in FIG. 1, and transmitter 10 is shown in greater detail. In FIG. 2, sensor 18 is illustratively a process variable sensor that receives input 14 from a process being sensed. The input 14 is illustratively the process fluid flowing through piping 7, and sensor 18 is illustratively a temperature sensor. However, sensor 18 could also be a different type of sensor, such as one for sensing pressure, pH, flow, etc. Sensor 18 could also be one of a number of different types of temperature sensors. For instance, sensor 18 can be a thermocouple or a resistive temperature device (RTD). In the latter case, transmitter 10 also includes a controllable current source that provides an excitation current to sensor 18. In any of these embodiments, sensor 18 illustratively provides an analog output 20, indicative of the sensed parameter, to an analog-to-digital (A/D) converter 22 in transmitter 10.

In one embodiment, it should be noted that the output 20 from sensor 18 can illustratively be provided to a circuit (not shown) that amplifies and filters the analog signal, as appropriate. This can be part of sensor 18 or transmitter 10, or a separate circuit. The amplified and filtered signal 20 is then provided to A/D converter 22. A/D converter 22 provides a digitized output to processor 24, which is a digital representation of the analog signal 20 provided by sensor 18. Processor 24 has associated memory and clock circuitry, and provides information regarding the sensed parameter over process control loop 11. It should be noted that processor 24 can include an input/output (I/O) circuit, or an I/O circuit can be provided separately, that transmits information in a digital format on loop 11, or in an analog format by controlling current flow through loop 11.

The embodiment shown in FIG. 2 illustrates that A/D converter 22 also includes noise detection component 26. Noise detection component 26 monitors the noise level in the sensor output 20 and is disposed either internally, or externally, to A/D converter 22. Component 26 is shown internal to A/D converter 22 in the example shown in FIG. 2, but this is shown by way of example only. Noise detection component 26 monitors the noise as the input signal 20 is being digitized by A/D converter 22.

Figure 3:
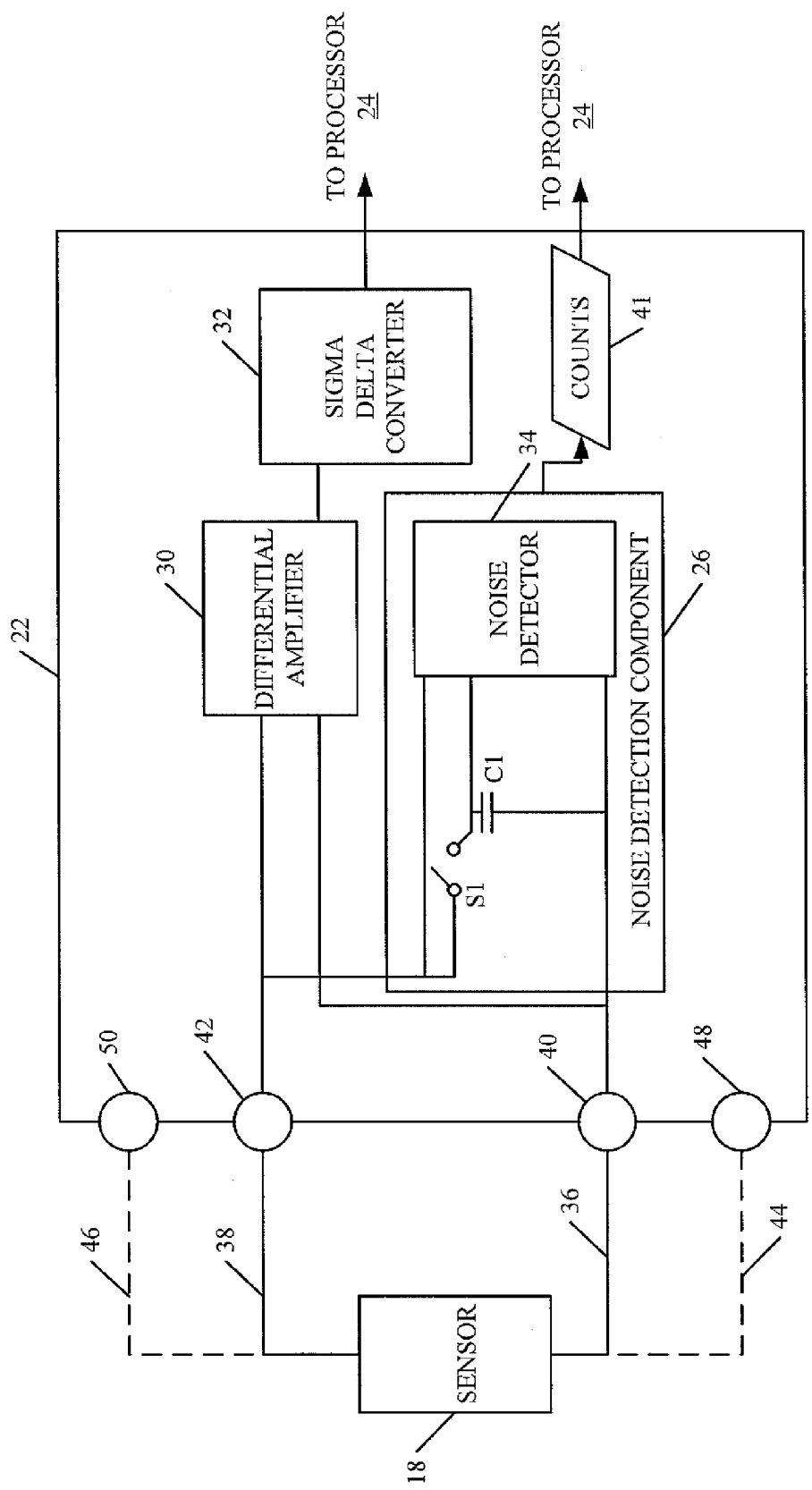
FIG. 3 is a partial block diagram, partial schematic diagram, showing an analog-to-digital converter with a noise detector.

FIG. 3 is a more detailed diagram of A/D converter 22, and noise detection component 26. In the embodiment shown in FIG. 3, A/D converter 22 illustratively includes a differential amplifier 30 and a sigma delta converter 32. Sigma delta converter 32 is shown by way of example, and other conversion mechanisms can be used as well.

FIG. 3 also shows that noise detection component 26 illustratively includes noise detector 34, switch S1 and capacitor C1. FIG. 3 shows that sensor 18 has two leads 36 and 38 which can be coupled to input terminals 40 and 42, respectively. In one embodiment, the voltage across terminals 40 and 42 is indicative of the temperature sensed by sensor 18. FIG. 3 also shows that sensor 18 can illustratively be a four lead sensor with additional leads 44 and 46 coupled to additional terminals 48 and 50. Or, additional sensors can be coupled to those terminals and a multiplexor can be used to select input signals for measurement. However, for the sake of the present example, the description will proceed with respect to sensor 18 having two leads connected to terminals 40 and 42, respectively.

A more detailed operation of noise detection component 26 is described below with respect to FIGS. 4 and 5. Briefly, however, voltage $V_{input}$ is developed across terminals 40 and 42 and represents the temperature sensed by sensor 18. This input voltage is provided to differential amplifier 30 where it is amplified and provided to converter 32 for conversion into a digital signal, that is provided to processor 24. $V_{input}$ is also latched, at a specified rate, and held, across capacitor C1. This is done by closing switch S1. $V_{input}$ is compared, in noise detector 34, to a transmitter-specified threshold voltage over a number of clock periods. Two accumulators (or counters) are used. If the voltage difference between $V_{input}$ and the transmitter-specified threshold is greater than or less than a threshold value, one of the two accumulators is incremented. One of the accumulators is incremented for noise events in the positive direction, while the other is incremented for noise events in the negative direction. The values in the accumulators are referred to as noise counts 41. Once $V_{input}$ has been digitized by converter 32, the noise counts 41 are provided from noise detector 34 to processor 24 for use in characterizing the types of noise detected.

Figure 4:
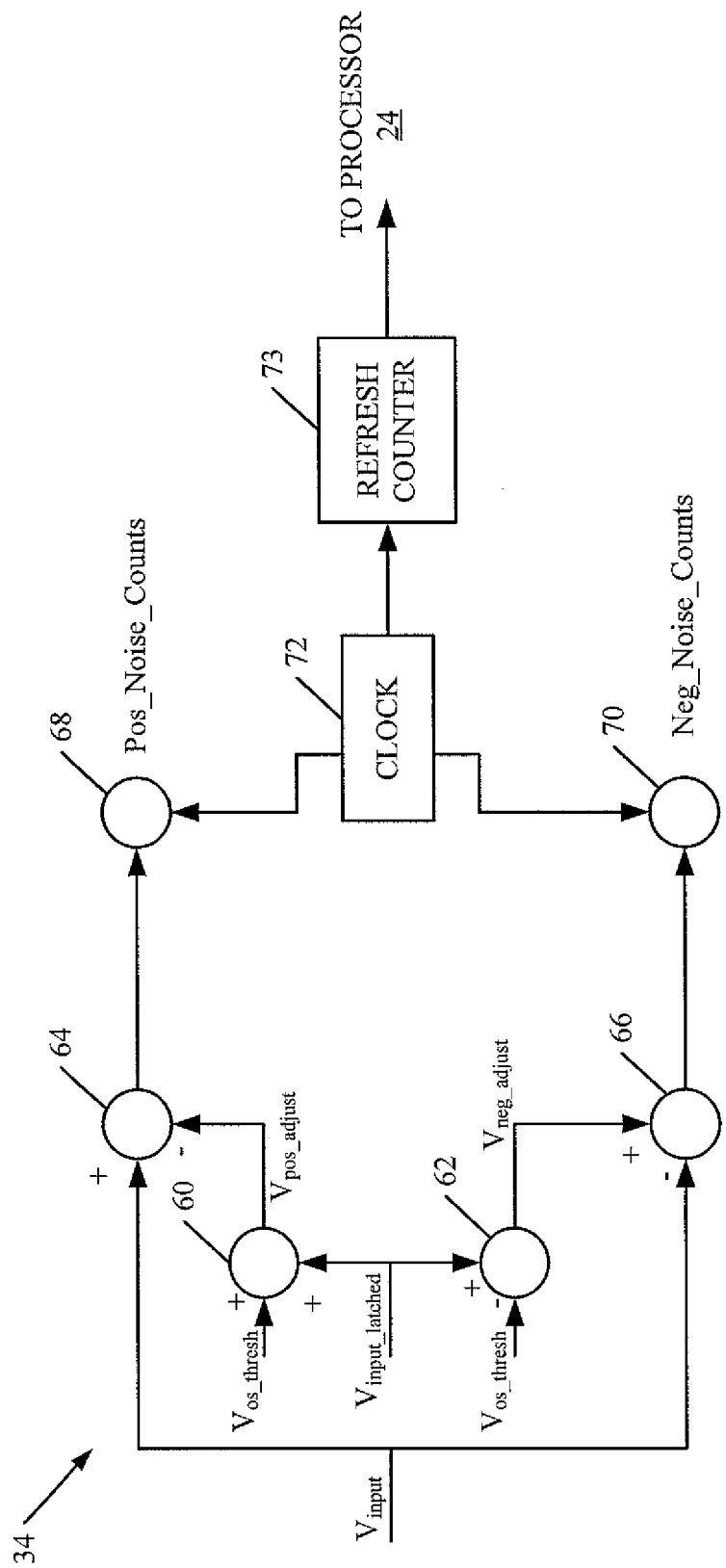
FIG. 4 is a flow diagram illustrating one embodiment of the operation of the analog-to-digital converter shown in FIG. 3.

FIG. 4 is a more detailed block diagram of noise detector 34. FIG. 5 is a flow diagram illustrating the operation of noise detection component 26 in greater detail. FIGS. 4 and 5 will now be described in greater detail in conjunction with one another.

Figure 5:
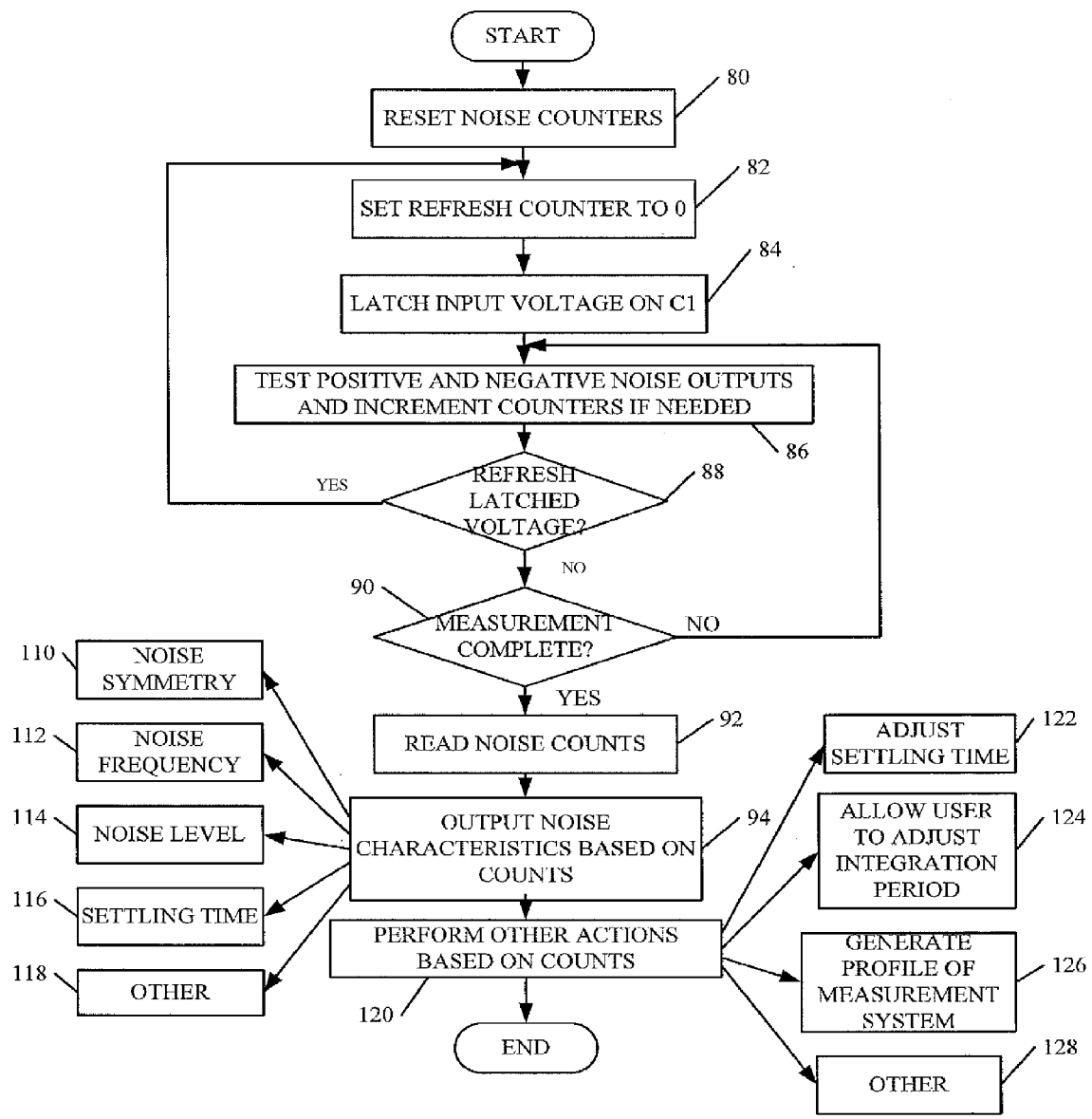
FIG. 5 is a diagram of a noise count accumulator in a noise detection component.

Prior to describing the operation illustrated in FIG. 5, the elements of FIG. 4 will first be briefly discussed. $V_{input}$ in FIG. 4 is the input voltage developed across sensor 18 (in FIG. 3) and applied between leads 40 and 42. $V_{input\_latched}$ is the voltage across capacitor C1 (again in FIG. 3) when switch S1 is closed. $V_{os\_thresh}$ is a voltage set point that is used by positive and negative threshold generators 60 and 62 to generate positive and negative thresholds ($V_{pos\_adjust}$ and $V_{neg\_adjust}$). In the embodiment shown, the threshold generators are comprised of a set of summing nodes 60 and 62. $V_{input\_latched}$ is added to noise threshold $V_{os\_thresh}$ at summing node 60 and $V_{os\_thresh}$ is subtracted from $V_{input\_latched}$ at summing node 62. It should also be noted that the noise threshold $V_{os\_thres}$ can be determined empirically or it can vary from implementation-to-implementation. Similarly, two different thresholds could be used to generate $V_{pos\_adjust}$ and $V_{neg\_adjust}$. In one embodiment, the value(s) of $V_{os\_thresh}$ is set in firmware or at manufacturing time so the user need not set it or adjust it. Further, it can be adjustable by the user and the decision as to the particular threshold voltage can be made during implementation. Also, the threshold values can be variable based on a variety of different parameters, such as the value of the sensor signal, or other parameters.

The resultant positive and negative threshold voltages ($V_{pos\_adjust}$ and $V_{neg\_adjust}$) are provided to comparators 64 and 66 where they are compared with $V_{input}$. The output of comparators 64 and 66 are provided to the input of counters 68 and 70, respectively, which receive a clock input from clock 72. When $V_{input}$ exceeds $V_{pos\_adjust}$ in the positive direction, and when clock 72 provides a clock pulse, counter 68 will increment by one. Similarly, when $V_{input}$ exceeds $V_{neg\_adjust}$ in the negative direction, and when clock 72 provides a clock pulse to counter 70, then counter 70 will increment by one. In essence, during every clock cycle of clock 72, the output of comparators 64 and 66 are evaluated and noise registers (or counters) 68 and 70 are used to accumulate counts corresponding to both positive and negative noise events if the positive and negative noise threshold voltages ($V_{pos\_adjust}$ and $V_{neg\_adjust}$) are exceeded. Refresh counter 73 is also clocked by clock 72 and provides a method to refresh $V_{input\_latch}$ at a predetermined rate. The refresh counter counts up to the refresh period where it refreshes the voltage latched across capacitor C1 at a refresh rate based on the output from counter 73.

The embodiment shown in FIG. 4 is only one illustrative embodiment, and others could be used as well. For instance, in some applications only a single noise counter can be used and incremented with a positive noise event and decremented with a negative noise event. This could be used to characterize noise symmetry, for example.

With this explanation of FIG. 4, the overall operation of A/D converter 22 in detecting noise will now be described with respect to FIG. 5. FIGS. 3-5 will be described in conjunction with one another.

In one embodiment, before detecting noise, processor 24 provides a reset signal to counters 68 and 70, to reset the noise counters. This is indicated by block 80 in FIG. 5. Processor 24 also illustratively resets refresh counter 73. This is indicated by block 82 in FIG. 5.

Processor 24 then latches $V_{input}$ across capacitor C1 by closing switch S1. This is indicated by block 84 in FIG. 5. $V_{input}$ can be latched across capacitor C1 at some point in time during which converter 32 is performing the analog-to-digital conversion on $V_{input}$. In one embodiment, it is latched at the beginning of the conversion process, but it can be refreshed intermittently, as well. That is, processor 24 can open switch S1 and close it again every X number of counts output by refresh counter 73. The particular refresh rate can be set empirically, or adjusted based on a given application, or otherwise. It can be set in firmware or at manufacturing time, so the user need not set the refresh rate. Further, the user can be provided with the ability to reset the refresh rate, as desired.

In any case, once $V_{input}$ is latched across capacitor C1, summing nodes 60 and 62 generate the positive and negative threshold voltages $V_{pos\_adjust}$ and $V_{neg\_adjust}$ which are applied to comparators 64 and 66. As briefly mentioned above, when $V_{input}$ exceeds $V_{pos\_adjust}$ in the positive direction, then counter 68 is incremented for each clock cycle of clock 72. Similarly, when $V_{input}$ exceeds the negative threshold $V_{neg\_adjust}$ in the negative direction, then counter 70 is incremented for each clock cycle of clock 72. Testing the positive and negative noise output and incrementing counters 68 and 70, as needed, is indicated by block 86 in FIG. 5. After each clock cycle, it is determined whether refresh counter 73 has reached a count value that indicates that the latched voltage $V_{input\_latched}$ should be refreshed. If so, processing reverts to block 82 where refresh counter 73 is set to zero. Making the determination of whether the refresh counter is to be reset is indicated by block 88 in FIG. 5.

If, at block 88 it is determined that the refresh counter need not be reset yet, then processor 24 determines whether converter 32 has completed its measurement of $V_{input}$. This is indicated by block 90 in FIG. 5. If not, processing reverts back to block 86 where detector 34 continues to test the positive and negative noise outputs and increment counters 68 and 70, as needed.

However, if, at block 90, it is determined that the A/D conversion has been completed, then the counts 41 provided by counters 68 and 70 are output to processor 24. This is indicated by block 92 in FIG. 5. Processor 24, in turn, can characterize the noise detected based on the counts 41.

Processor 24 can then output the noise characteristics that it has identified, based on the counts 41 from counters 68 and 70. Outputting the noise characteristics is indicated by block 94 in FIG. 5.

While there are a wide variety of different noise characteristics that can be identified by processor 24, based upon counts 41, a number of them will now be described for the sake of example only.

A first noise characteristic is referred to as noise symmetry. If both the positive and negative counters 68 and 70 provide counts that are equal, and those counts do not exceed a threshold value (i.e., they are not excessive), then processor 24 can determine that the noise is symmetric. This can provide an indication that the measurement output will be impacted by the measurement noise, but it allows processor 24 to provide an indication to the user that a degraded condition may exist. This type of noise can be induced by degrading thermocouples in a plant environment where noise currents are causing measurable voltages to be developed on higher impedance lines. This can inform the user that they are to provide maintenance to their sensor measurement loop, or other maintenance.

A second characteristic is reflective of noise frequency. That is, processor 24 can consider the refresh rate that defines the period that $V_{input}$ is latched across capacitor C1, and also the quantity of counts output by counters 68 and 70. Given these parameters, the approximate noise frequency can be determined. If a new voltage level is latched periodically within the measurement process, but noise counts are still accumulated, this allows processor 24 to estimate, at least roughly, the quantity of noise that is in the given measurement.

Yet another noise characteristic is the noise level. The noise level can be estimated by the quantity of counts output by counters 68 and 70, and the selected voltage threshold level $V_{os\_thresh}$. The threshold level may be adjusted to provide information to processor 24, and ultimately to the user, as to how much noise exists in the system. This can be important when thermal electromotive forces (EMFs) are generated on RTD measurement lines. If connection points are corroded or frayed, and the temperature gradient exists across this connection, a dynamic EMF condition can be induced on the RTD measurement. In this case, the user can be made aware of this, so that they can perform maintenance on the measurement loop. Processor 24 can generate a message that informs the user of this maintenance need.

Yet another noise characteristic is reflective of whether the settling time is sufficient. That is, if the measurement voltage $V_{input}$ is latched across capacitor C1 at the beginning of the digitization process performed by converter 32, and assuming there are a relatively large number of noise counts in the positive or negative direction (but not both), then processor 24 can determine that the settling time needs to be adjusted. After adjusting the settling time, a new measurement can be calculated. This process can help initialize settling time for the connected measurement loop to provide the highest level of accuracy with the best update rate.

Figure 6:
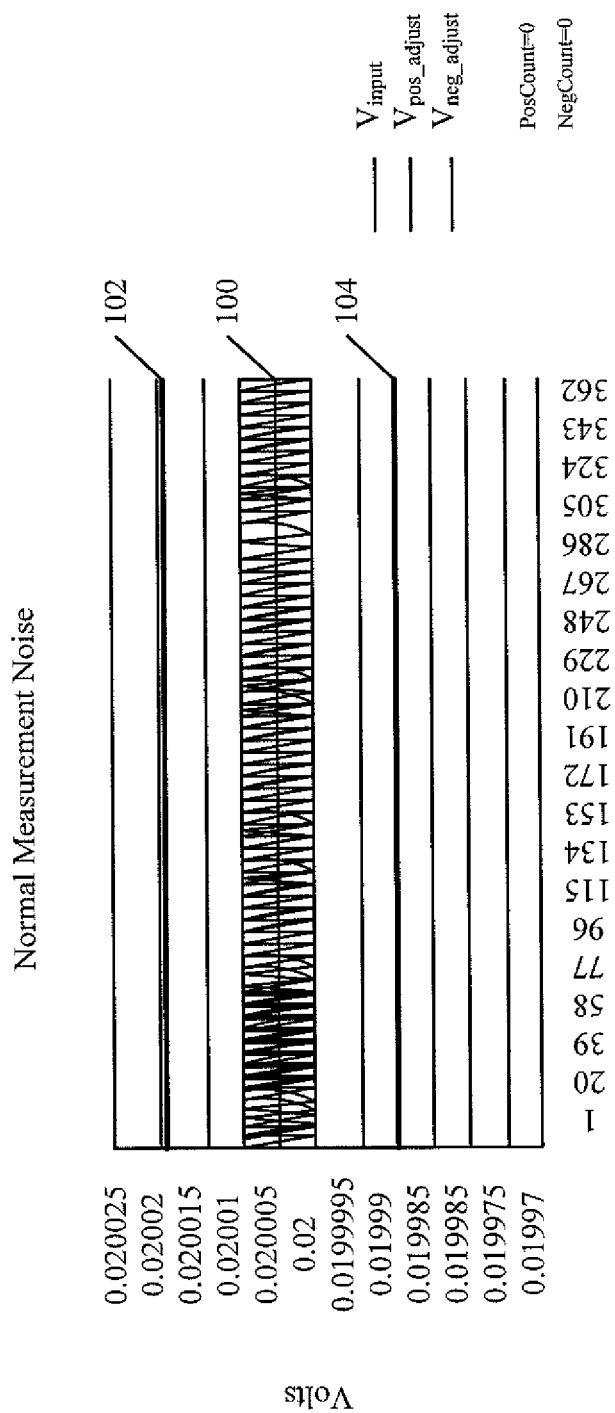
FIGS. 6-8 show graphical plots of counts versus voltage.
Figure 7:
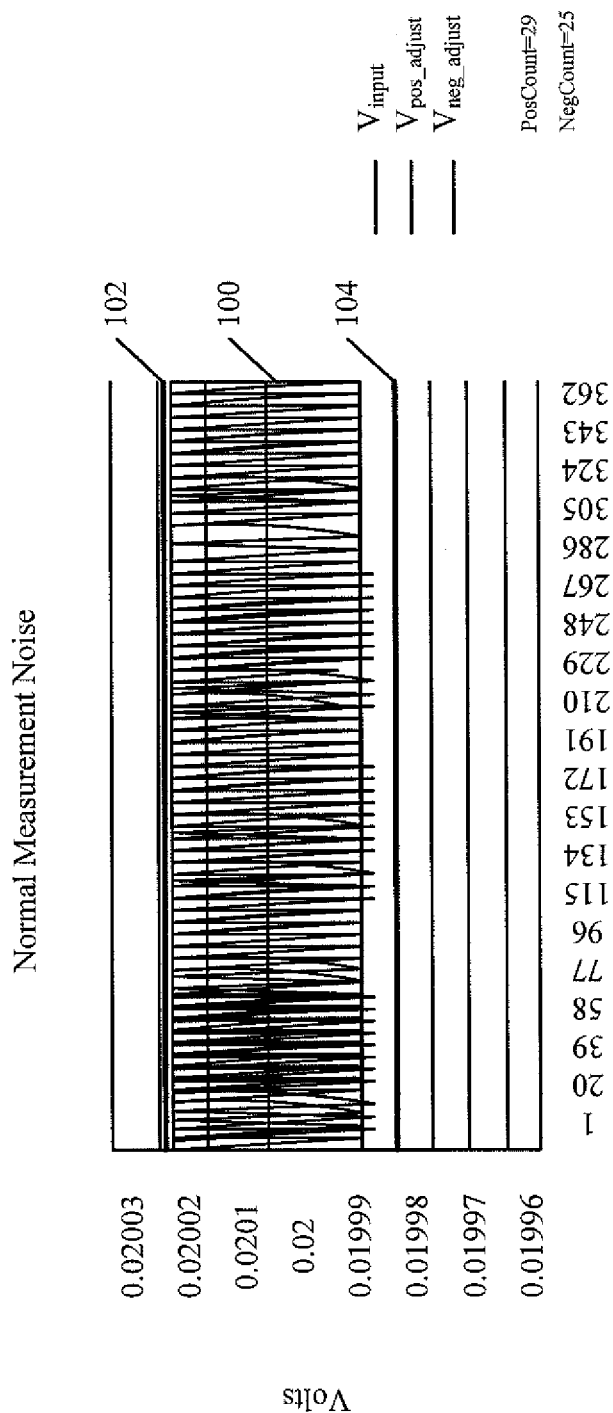
Figure 8:
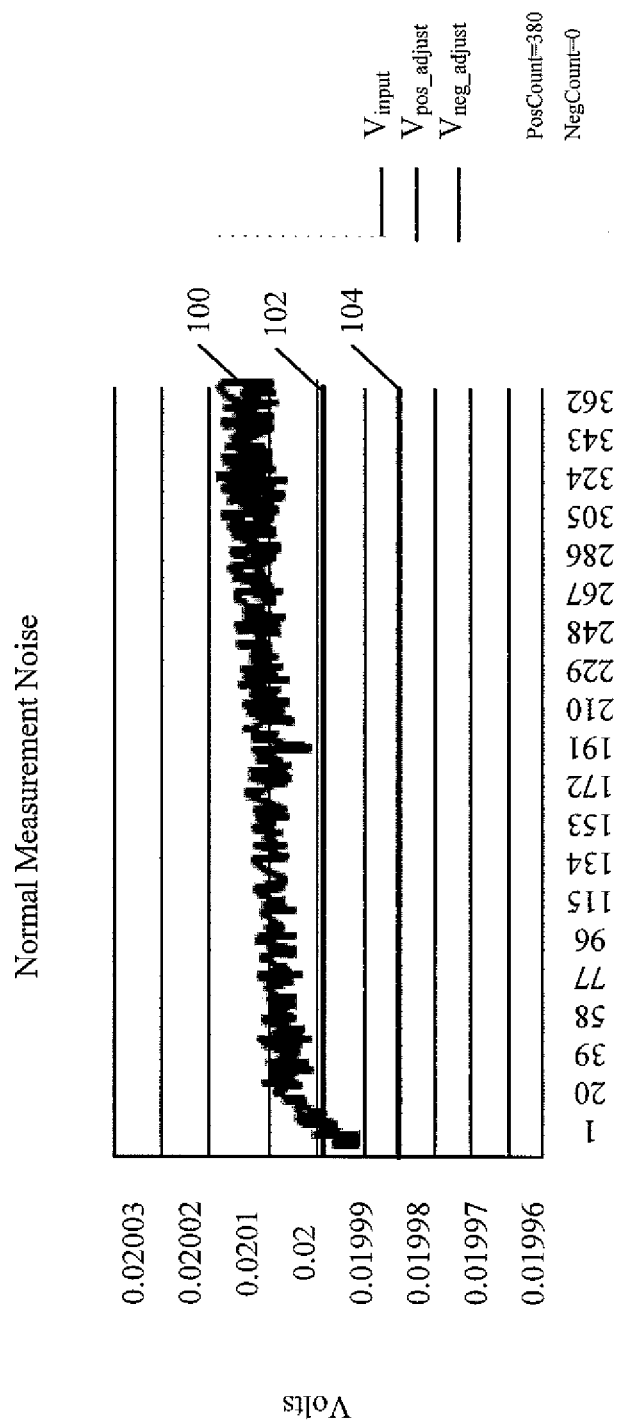

FIGS. 6-8 are plots of counters 68 and 70 along the x axis versus voltage along the y axis. FIGS. 6-8 illustrate some of the noise characteristics. In FIG. 6, $V_{input}$ is indicated by line 100 and $V_{pos\_adjust}$ is indicated by line 102, while $V_{neg\_adjust}$ is indicated by line 104. FIG. 6 illustrates what might be a reflection of normal measurement noise. That is, $V_{input}$ varies well within the thresholds established by threshold voltages 102 and 104. It can be seen that the output from counters 68 and 70 are both zero, because $V_{input}$ has not crossed either threshold 102 or 104 during the measurement cycle.

FIG. 7 is similar to FIG. 6, and similar items are similarly numbered. However, it can be seen in FIG. 7 that $V_{input}$ 100 does cross the threshold voltages 102 and 104 by a certain number of times. The positive count from counter 68 is 29 counts while the negative count from counter 70 is 25 counts. This indicates that the noise is slightly asymmetrical in the positive direction.

FIG. 8 is also similar to FIG. 6, and similar items are similarly numbered. However, FIG. 8 shows that, other than the very beginning of the measurement cycle, $V_{input}$ is above positive threshold 102 the entire time. Therefore, the positive counts output by counter 68 are 380, while there are no negative counts. This tends to indicate that the settling time is inaccurate and needs to be adjusted.

Referring again to FIG. 5, having processor 24 output an indication of noise characteristics corresponding to noise symmetry is indicated by block 110. Outputting a noise characteristic corresponding to noise frequency is indicated by block 112, while outputting an indication as to noise level is indicated by block 114, and outputting an indication that reflects a settling time issue is indicated by block 116. Of course, processor 24 can generate other outputs 118 as well, indicative of other noise characteristics.

It will be appreciated that processor 24, or other components of transmitter 10, can perform other actions as well based upon the counts output by counters 68 and 70. Performing these other actions is indicated by block 120 in FIG. 5. For instance, processor 24 can adjust the settling time as indicated by block 122, or it can allow the user to adjust the integration period for the measurement cycle as indicated by block 124. Similarly, processor 24 can generate a profile of the measurement system based on the noise characteristics identified from counts 41 output by counters 68 and 70. This is indicated by block 126 in FIG. 5. Generating a profile can be done in a wide variety of ways. For instance, using a learning process, such as statistical process monitoring, processor 24 can generate a profile of the measurement system which can be referred to over time. This can help understand what noise level, refresh rate, and settling time should be used to configure each specific user installation. The noise level at startup can be used as a baseline for comparison of other measurement sample periods over time, as well. Transmitter 10, or other components can take a variety of other actions as well, and this is indicated by block 128 in FIG. 5.

Similarly, the counts can be used to detect line frequency that the measurement loop may be exposed to. For instance, in some user installations, a line frequency (such as 50 Hz or 60 Hz) may be coupled to the measurement lines. In such an installation, a user may be provided with a settable parameter that allows the measurement to be integrated over this period of time.

It will also be appreciated that a plurality of noise detection components 26 can be provided in a given transmitter 10. Each can be configured to process a different noise characteristic during the measurement cycle. For example, one noise detection component 26 can be configured to specifically identify settling time issues, while another can focus on noise frequency and yet another on noise level, etc.

Figure 9:
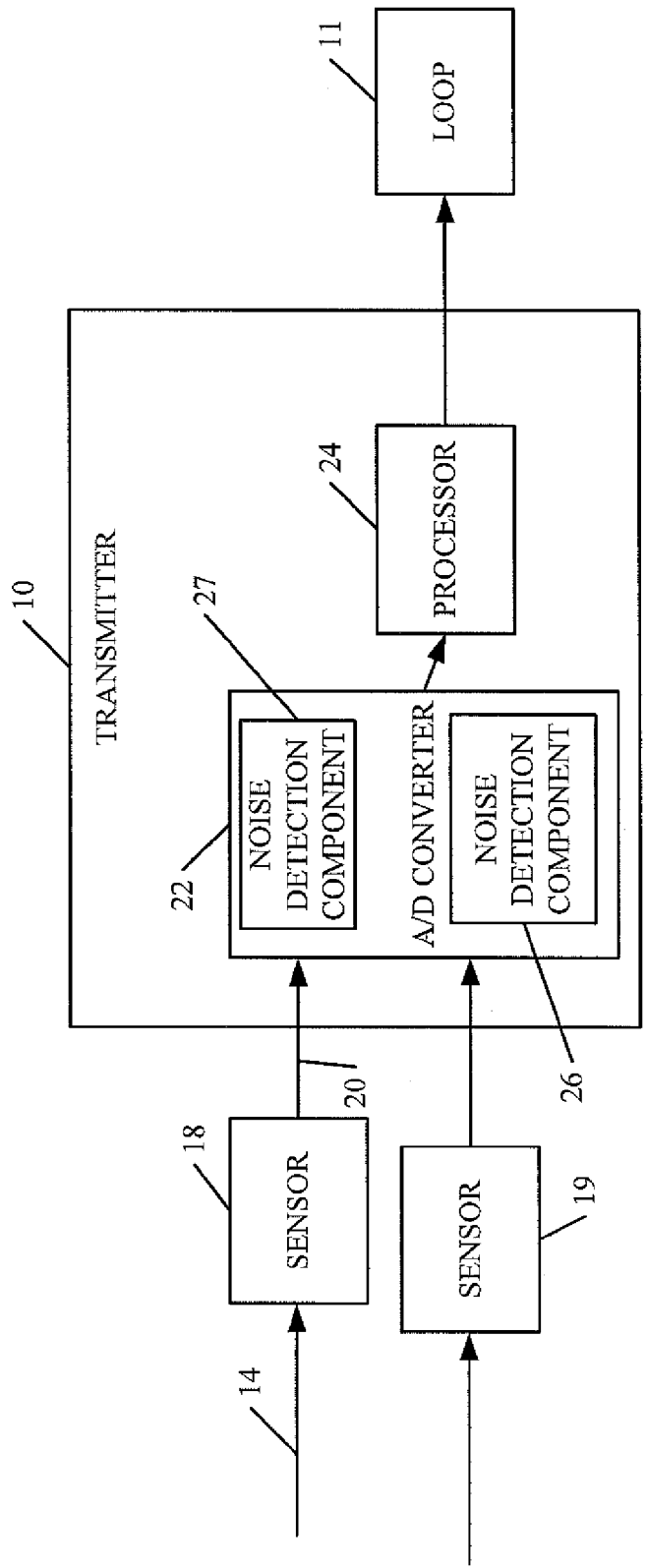
FIG. 9 is a block diagram similar to that shown in FIG. 3, except with multiple sensors.

In addition, noise detection component 26 can be used to continuously monitor the noise on each of a plurality of different sensors, independently, even when a given sensor output is not currently being measured by transmitter 10. FIG. 9 shows such an embodiment, which is similar to that shown in FIG. 2, except that a second sensor 19 is shown as well. Of course, a plurality of additional sensors can be provided and FIG. 9 shows only two sensors for the sake of example. In the embodiment in FIG. 9, it may be that transmitter 10 receives one sensor input at a time through a multiplexor. Thus it may be that transmitter 10 is not measuring the output of sensor 18 because it is measuring the output of sensor 19. In that case, however, noise detection component 27 is still detecting the noise on the output of sensor 18. Therefore, while noise detection component 26 is detecting the noise on the sensor 19 that is currently being measured by converter 22, the noise on the output of sensor 18 is also being detected by noise detection component 27, because detecting noise on the output of a sensor when it is not being measured can be meaningful and helpful as well. This embodiment can also allow the system to characterize noise differences among the different sensors.

The system can also help to accurately compensate for the sensed noise. Once the noise is characterized, compensation becomes more accurate. Further, the clock signal used to clock the counters can be controlled to obtain more information. If the clock frequency is increased, higher frequency noise components can be detected. Therefore, the clock frequency can be controlled as desired.

Although the present invention has been described with reference to preferred embodiments, workers skilled in the art will recognize that changes may be made in form and detail without departing from the spirit and scope of the invention.

What is claimed is:

1. A process variable transmitter, comprising:
   a process variable sensor configured to sense a process variable of an industrial process and responsively provide a sensor signal representative of the sensed process variable;
   an analog-to-digital (A/D) converter receiving the sensor signal provided by the process variable sensor that senses the process variable and converts the sensor signal to a digital signal at a conversion rate;
   a processor that receives the digital signal and provides a measurement output indicative of the process variable based upon the digital signal; and
   a noise detector that receives the sensor signal at a refresh rate that is greater than the conversion rate, and generates a first value indicative of a number of positive noise events relative to a positive threshold value, and a second value indicative of a number of negative noise events relative to a negative threshold value, the processor evaluating the positive noise events and the negative noise events and generating a noise output that is indicative of detected noise based on the first and second values,
   wherein the noise detector comprises:
     a positive noise threshold generator that receives the sensor signal and generates the positive threshold value as a positive voltage threshold; and
     a negative noise threshold generator that receives the sensor signal and generates the negative threshold value as a negative voltage threshold.

2. The process variable transmitter of claim 1 wherein the noise detector further comprises:
   a positive noise counter that receives the sensor signal, a clock input and the positive voltage threshold and accumulates the positive noise events with each clock pulse on the clock signal when the sensor signal exceeds the positive voltage threshold in a positive direction.

3. The process variable transmitter of claim 2 wherein the noise detector further comprises:
   a negative noise counter that receives the sensor signal, a clock input and the negative voltage threshold and accumulates the negative noise events with each clock pulse on the clock signal when the sensor signal exceeds the negative voltage threshold in a negative direction.

4. The process variable transmitter of claim 3 wherein the processor generates the noise output based on the accumulation of the positive and negative noise events.

5. The process variable transmitter of claim 4 wherein the processor generates the noise output as a characterization of noise based on the accumulation of the positive and negative noise events.

6. The process variable transmitter of claim 5 wherein the processor generates the characterization of noise as the A/D converter is converting the sensor signal to the digital signal.

7. The process variable transmitter of claim 5 wherein the processor generates the noise output by analyzing the first and second values to identify noise symmetry, noise frequency and noise level.

8. The process variable transmitter of claim 6 wherein the A/D converter converts the sensor signal to the digital signal over a settling time and wherein the processor generates the noise output to identify whether settling time is contributing to measurement inaccuracies.

9. The process variable transmitter of claim 5 wherein the processor generates a noise profile for the process variable transmitter based on characterizations of the noise over time.

10. The process variable transmitter of claim 1 wherein the processor intermittently latches the sensor signal across a storage capacitor at the refresh rate and wherein the positive and negative noise threshold generators receive, as the sensor signal, the voltage across the storage capacitor.

11. The process variable transmitter of claim 10 wherein the noise detector further comprises:
a refresh counter, wherein the processor refreshes the sensor signal latched across the storage capacitor based on an output from the refresh counter.

12. The process variable transmitter of claim 1 wherein the noise detector is a part of the A/D converter.

13. The process variable transmitter of claim 1 wherein the noise detector is separate from the A/D converter.

14. The process variable transmitter of claim 1 wherein the processor provides the measurement output over a process control loop.

15. The process variable transmitter of claim 1 wherein the sensor comprises at least one temperature sensor selected from a group comprising a resistive temperature device and a thermocouple.

16. The process variable transmitter of claim 1 wherein the noise output is indicative of line noise.

17. The process variable transmitter of claim 1 wherein the noise detector monitors noise from a plurality of sensor signals.

18. A method of sensing a process variable in a process variable transmitter, comprising:
sensing the process variable with a process variable sensor and responsively providing an analog sensor signal;
receiving the analog sensor signal from the sensor indicative of the process variable;
converting the analog sensor signal to a digital signal with an analog to digital converter at a conversion rate;
during conversion of the analog sensor signal to the digital signal, accumulating positive noise counts in a positive noise accumulator with a noise count accumulator that are indicative of noise events that exceed a positive noise threshold, and negative noise counts in a negative noise accumulator that are indicative of noise events that exceed a negative noise threshold, at a refresh rate that is greater than the conversion rate;
characterizing noise on the analog sensor signal based on the positive noise counts and the negative noise counts with a processor; and
generating an output on a process control loop indicative of the digital signal and the characterization of the noise on the analog sensor signal.

19. The method of claim 18 wherein accumulating positive noise counts comprises generating the positive noise threshold based on the sensor signal and wherein accumulating negative noise counts comprises generating the negative noise threshold based on the sensor signal.

20. The method of claim 19 wherein generating the output indicative of characterization of the noise comprises:
generating the output to identify at least one of an estimate of noise symmetry, noise frequency, noise level, a source of the noise, and a noise profile for the process variable transmitter.

21. A process variable transmitter, comprising:
a process temperature sensor configured to sense a process temperature of an industrial process, and responsively provide a process temperature sensor signal;
an analog-to-digital (A/D) converter receiving the process temperature sensor signal provided by the process temperature sensor that senses a process temperature and converts the temperature sensor signal to a digital signal at a conversion rate;
a processor that receives the digital signal and controls current on a process control loop to provide a measurement output indicative of the digital signal; and
a noise detector that receives the process temperature sensor signal and generates, during conversion of the process temperature sensor signal to the digital signal at a refresh rate that is greater than the conversion rate, a first count value indicative of a number of positive noise events relative to a positive threshold value and a second count value indicative of a number of negative noise events relative to a negative threshold value, the processor generating a noise output that is indicative of a characteristic of detected noise based on the first and second count values,
wherein the noise detector comprises:
a positive noise threshold generator that receives the process temperature sensor signal and generates the positive threshold value as a positive voltage threshold; and
a negative noise threshold generator that receives the process temperature sensor signal and generates the negative threshold value as a negative voltage threshold.

* * * * *